United States Patent
Bach

(10) Patent No.: US 7,579,881 B2
(45) Date of Patent: Aug. 25, 2009

(54) WRITE DRIVER CIRCUIT

(75) Inventor: Elmar Bach, Villach (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 11/940,293

(22) Filed: Nov. 14, 2007

(65) Prior Publication Data

US 2009/0121751 A1 May 14, 2009

(51) Int. Cl.
*H03K 3/00* (2006.01)
(52) U.S. Cl. ........................... 327/108; 327/109
(58) Field of Classification Search .............. None
See application file for complete search history.

(56) References Cited

U.S. PATENT DOCUMENTS

| | | | |
|---|---|---|---|
| 5,869,988 A * | 2/1999 | Jusuf et al. ............... | 327/110 |
| 6,697,205 B2 * | 2/2004 | Cyrusian et al. ............... | 360/68 |
| 6,717,220 B2 * | 4/2004 | Cheng et al. ............... | 257/360 |
| 7,110,198 B1 * | 9/2006 | Aram et al. ............... | 360/46 |
| 2002/0176198 A1 | 11/2002 | Cyrusian et al. | |
| 2004/0260986 A1 * | 12/2004 | Wuu et al. ............... | 714/718 |
| 2006/0151836 A1 * | 7/2006 | Salcedo et al. ............... | 257/362 |

* cited by examiner

*Primary Examiner*—Cassandra Cox
(74) *Attorney, Agent, or Firm*—Banner & Witcoff, Ltd.

(57) ABSTRACT

A write driver circuit comprising a first transistor comprising a first source/drain terminal coupled to a first output, a second source/drain terminal coupled with a first reference potential, and a gate terminal; a second transistor comprising a first source/drain terminal coupled to a second output, a second source/drain terminal coupled with the first reference potential, and a gate terminal; and a gate voltage generator coupled to the gate terminals of the first and second transistors.

20 Claims, 8 Drawing Sheets

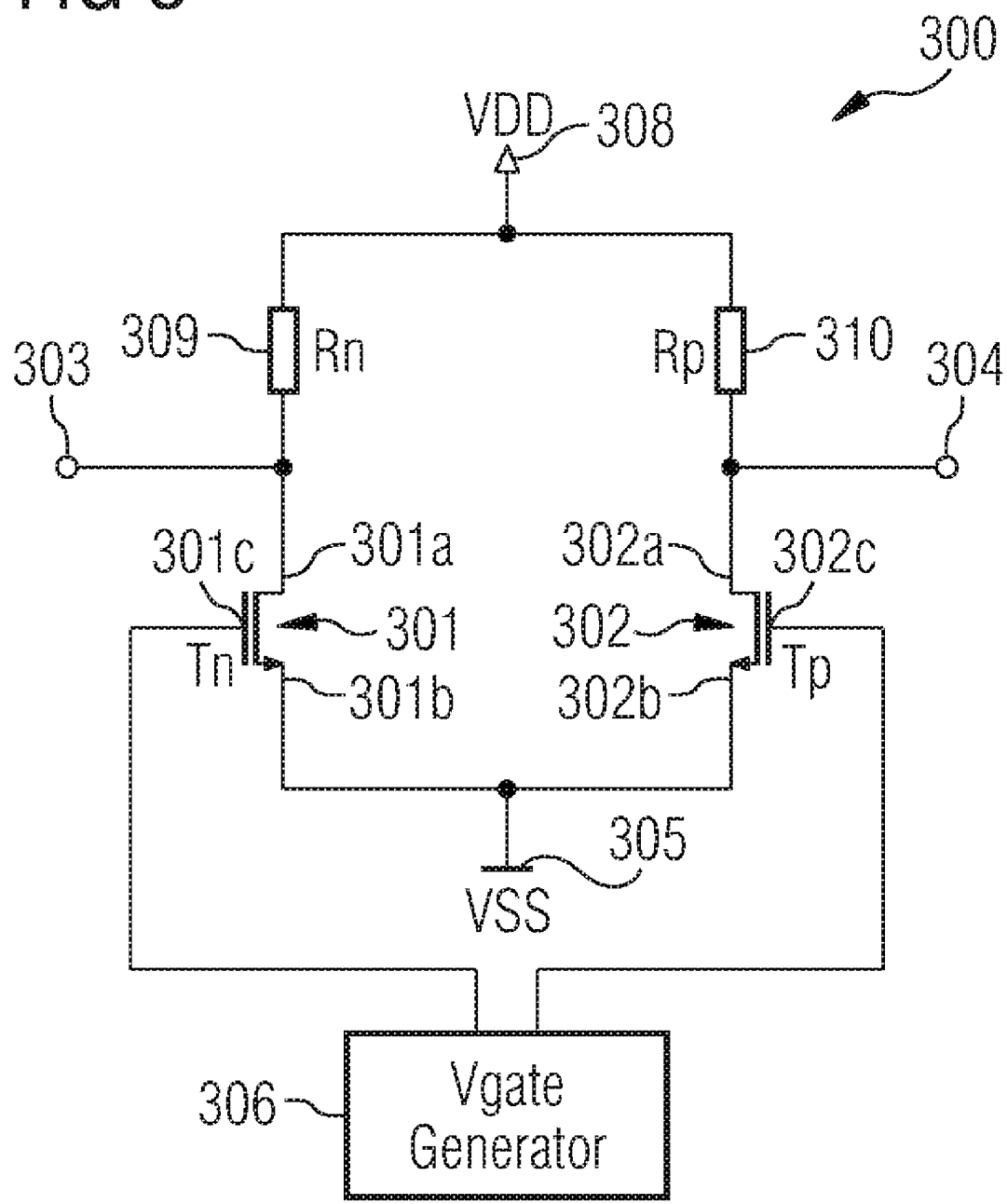

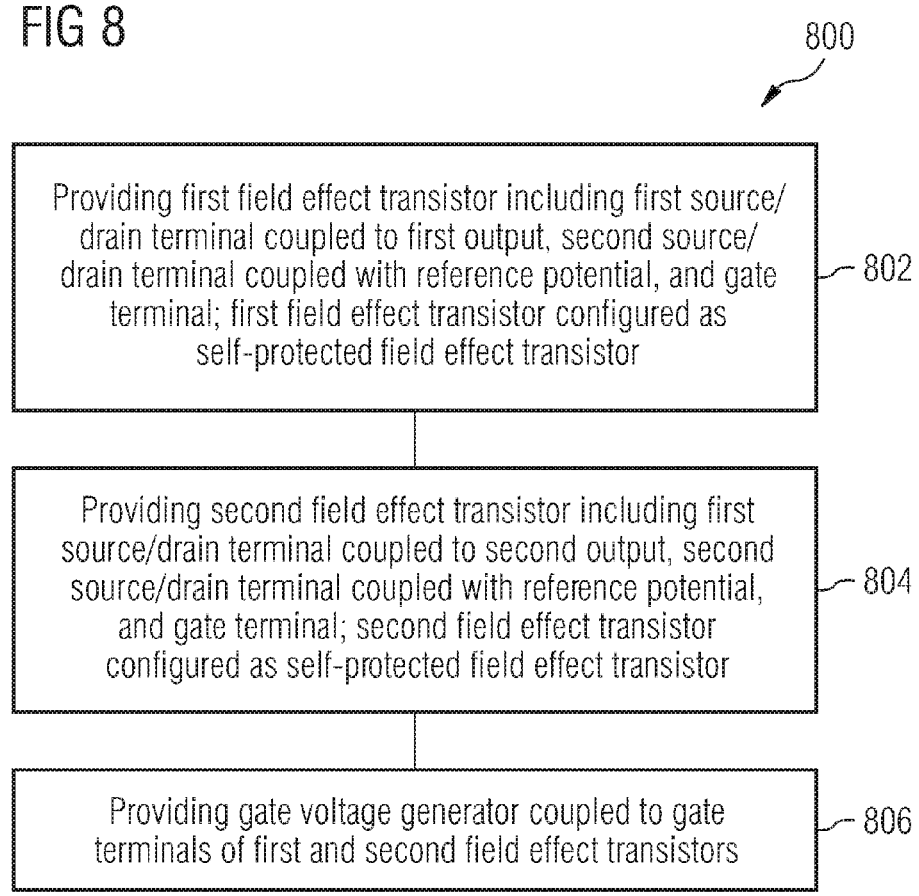

WRITE DRIVER CIRCUIT

BACKGROUND

The write output interface of a data processing channel usually is ideally intended to comply with two basic criteria, which are highest possible speed and highest possible robustness against electrostatic discharge (ESD) events. Meeting both criteria at the same time is a difficult task for e.g. the following reasons. On the one hand, in order to achieve a high speed, reduction of capacitances at the write interface is desired. On the other hand, in order to achieve a high robustness against ESD events, large protection structures are commonly used, which add to the capacitance at the write pins. In the following description, the terms "write pin", "output pin" or just "pin" are used interchangeably and are understood to mean an output pin or write pin of a write driver circuit.

Besides the afore-mentioned basic criteria, a write driver may have to fulfill certain specifications for the signal swing, which is commonly very large to cope e.g. with losses on the driven lines or to provide sufficient input swing for connected input stages to operate properly. Often, the desired high-swing is complemented by a need for a large common-mode voltage at the write pins. As an example, a typical differential signal swing may be about 600 mV peak-to-peak at a common-mode voltage of, for example, 2.5 V.

In modern deep sub-micron CMOS processes (complementary metal oxide semiconductor) the maximum voltages that the highest speed core devices can handle may often be limited because these devices are commonly build with the thinnest available gate-oxide thickness. For example, in a 130-nm process, core devices may typically handle voltages up to about 1.5 V, in a 90-nm process, core devices may, for example, handle voltages up to about 1.3 V, and in a 65-nm process, core devices may, for example, handle voltages up to about 1.1 V. Such low maximum voltages may cause problems when high common-mode voltages are used, in particular common-mode voltages that are higher than the maximum voltages that can be handled by the core devices. In this case, special circuits may have to be developed to allow an operation of low-voltage devices at a high common-mode voltage.

Another property of low-voltage devices is that they are usually not very robust with respect to ESD discharge voltages. Hence, special measures to limit ESD voltages to the maximum tolerated levels may be implemented. Furthermore, in typical differential write interfaces, a direct pin-to-pin ESD discharge event may be possible which may apply even stronger stress conditions to the devices that connect to the pins.

SUMMARY

Various aspects are described herein. For example, according to some aspects, a write driver circuit comprises a first transistor comprising a first source/drain terminal coupled to a first output, a second source/drain terminal coupled with a first reference potential, and a gate terminal; a second transistor comprising a first source/drain terminal coupled to a second output, a second source/drain terminal coupled with the first reference potential, and a gate terminal; and a gate voltage generator coupled to the gate terminals of the first and second transistors.

These and other aspects will be described herein in connection with various illustrative embodiments.

BRIEF DESCRIPTION OF THE DRAWINGS

In the drawings, like reference characters generally refer to the same parts throughout the different views. The drawings are not necessarily to scale, emphasis instead generally being placed upon illustrating the principles of various aspects of the invention. In the following description, various embodiments are described with reference to the following drawings, in which:

FIG. 3 shows another illustrative embodiment of a write driver circuit;

FIG. 8 shows a flowchart of an illustrative embodiment of a method of manufacturing a write driver circuit.

DETAILED DESCRIPTION

One way to protect the devices in a write driver against ESD discharges is the use of an ESD protection circuit, which may use, for example, special ESD circuit design techniques to form a bypass for the discharge current and/or special ESD devices such as e.g. Silicon Controlled Rectifiers (SCR).

Figure 1:
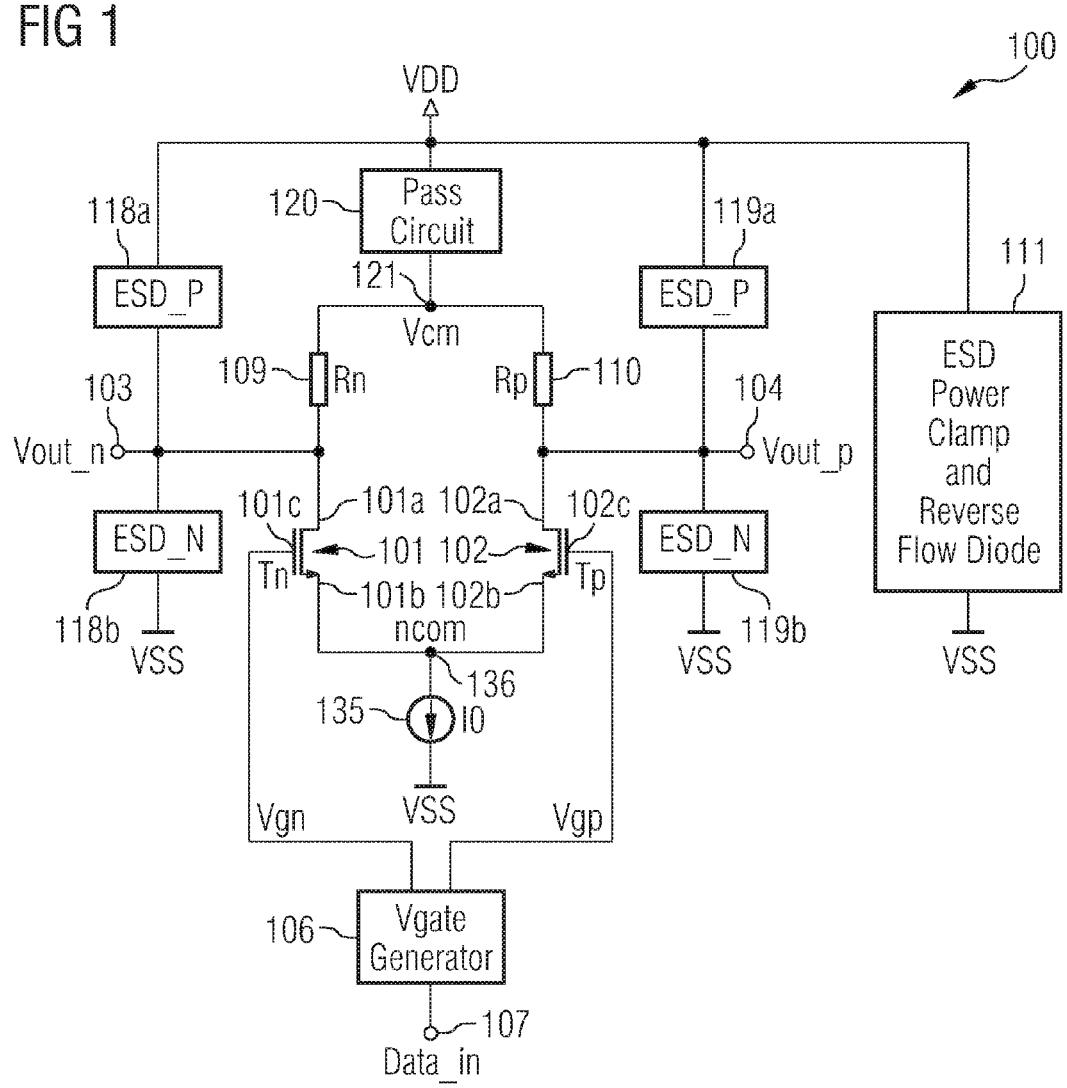
FIG. 1 shows an illustrative embodiment of a write driver circuit.

Write driver circuits commonly include a differential pair with resistive pull-up. FIG. 1 shows an example of such a write driver circuit.

The write driver circuit 100 shown in FIG. 1 includes a first field effect transistor 101 (labelled "Tn") and a second field effect transistor 102 (labelled "Tp") that are configured as NMOS (n-type metal oxide semiconductor) field effect transistors. A source terminal 101a and a drain terminal 101b of the first field effect transistor 101 are coupled to a first output 103 and a node 136 (labelled "ncom"), respectively, and a source terminal 102a and a drain terminal 102b of the second field effect transistor 102 are coupled to a second output 104 and the node 136, respectively.

The write driver circuit 100 further includes a current source 135 coupled between the node 136 and a lower electrical supply potential (VSS potential). An output voltage Vout_n is provided at the first output 103, and an output voltage Vout_p is provided at the second output 104.

A gate terminal 101c of the first field effect transistor 101 and a gate terminal 102c of the second field effect transistor 102 are coupled to a circuit 106 (labelled "Vgate Generator") that provides a gate voltage Vgn to the gate terminal 101c of the first field effect transistor 101 and further provides a gate voltage Vgp to the gate terminal 102c of the second field effect transistor 102. The circuit 106 is coupled to a data input 107, at which a data input signal "Data_in" is provided.

The write driver circuit 100 further includes a first pull-up resistor 109 with a resistance Rn coupled between the first source terminal 101a of the first field effect transistor 101 and a node 121. The write driver circuit 100 further includes a second pull-up resistor 110 with a resistance Rp coupled between the first source/drain terminal 102a of the second field effect transistor 102 and the node 121. The resistances Rn and Rp may, for example, be in the range from about 10Ω (ohms) to about 20Ω.

Furthermore, the write drive circuit 100 includes a pass circuit 120 coupled between the node 121 and a higher electrical supply potential (VDD potential). The node 121 is at an electrical potential Vcm.

The write driver circuit 100 further includes an ESD power clamp 111 coupled between the VSS potential and the VDD potential. The power clamp 111 includes a reverse flow diode.

The write driver circuit 100 further includes a first ESD protection element 118a (labelled "ESD_P") coupled between the first output 103 and the VDD potential, and a second ESD protection element 119a (labelled "ESD_P") coupled between the second output 104 and the VDD potential. Furthermore, the write driver circuit 100 includes a third ESD protection element 118b (labelled "ESD_N") coupled between the first output 103 and the VSS potential, and a fourth ESD protection element 119b (labelled "ESD_N") coupled between the second output 104 and the VSS potential.

In the following, certain features and properties of the write driver circuit 100 will be described in more detail. In all further descriptions, a low-ohmic differential load that may be present between the output pins and outside of the chip is disregarded for the sake of simplicity.

The write driver circuit 100 includes a differential pair Tn/Tp with resistive pull-up Rn/Rp. The differential pair operates as a switch steering the current I0 provided by the tail current source 135 to the pull-up resistors Rn/Rp, hence forcing a voltage across the resistors. When current is fully switched to one of the resistors Rn/Rp, the other resistor is operated at zero current. In this way, the voltage at the respective output pin (that is, the voltage Vout_n at the first output 103 or the voltage Vout_p at the second output 104) is pulled to Vcm, which can be the positive supply VDD or a common-mode level regulated by the pass circuit 120 where applicable. The differential signal swing is equal to twice the voltage across the pull-up resistor, if no external resistors are considered. The input data "Data_in" is applied to the circuit 106 which generates differential gate voltages Vgn/Vgp to control the output transistors Tn/Tp.

If a high common-mode output voltage (Vout_n+Vout_p)/2 shall be reached at the output pins 103 and 104, then special precaution should be taken to avoid permanent stress to the gate oxides of the transistors Tn/Tp and to limit the maximum drain-to-source voltage in these devices. The voltage level at the node 136 ("ncom") may be determined by defining the gate voltages Vgn and Vgp in such a manner that the drain-to-source, drain-to-gate and drain-to-bulk voltages of the transistor devices Tn/Tp may stay within the technology limits. This may be done by the gate voltage generator circuit 106. Furthermore, proper Vgn/Vgp voltages may be derived depending on the input data without introducing pulse asymmetries in the differential write output voltage.

Besides the basic circuit elements, ESD protection units 118a, 118b, 119a, 119b to the positive (ESD_P) and the negative (ESD_N) supplies are provided in the circuit 100 to provide a bypass for discharge currents for protection of the devices in an ESD-event. The ESD_P and/or ESD_N elements may, for example, be implemented as pn-diodes. In this case, the ESD_P elements may clamp the pin voltage against VDD by forward biasing the pn-diode. Similar clamping against VSS may be achieved by the ESD_N elements when the pin voltage is lower than VSS. For completion of the ESD circuitry, the ESD power clamp 111 is provided, which clamps VDD to VSS and incorporates a reverse-flow diode to clamp VSS against VDD. The power clamp 111 provides a connection between VDD and VSS to complete the ESD discharge path in parallel to the protected devices 101, 102 (i.e. the differential pair Tn/Tp), the pull-up resistors 109, 110 (Rn/Rp) and the pass circuit 120. Both pn-diodes add to the parasitic capacitance with their junction capacitance.

Alternatively, so-called grounded gate NMOS (ggNMOS) devices may be used. These NMOS devices include a parasitic NPN device in parallel that opens in case the voltage across the device exceeds a certain trigger level. This effect is referred to as "snap-back" effect. With these devices, the pin voltage may be clamped against VSS without incorporation of the ESD power clamp in the discharge path. A ggNMOS ESD clamp may exhibit a larger parasitic capacitance than a pn-diode.

Both pn-diodes and ggNMOS devices are typically part of the standard device portfolio of mixed-signal chips.

The following ESD discharge cases may be considered when selecting the ESD protection elements:
 (i) pin voltage positive against VSS;
 (ii) pin voltage positive against VDD;
 (iii) VDD positive against pin;
 (iv) VSS positive against pin; and
 (v) Vout_p positive against Vout_n and vice-versa.

An ESD discharge event may be characterized by two voltages. One is the trigger voltage, which is the voltage level at which a bypass is opened to let discharge currents flow, and the other one is the hold voltage, which is the maximum voltage across the ESD clamps when the ESD discharge current is flowing The ESD discharge path for case (i) comprises the elements 118a/119a (ESD_P) as well as the ESD power supply clamp 111. Thus, a forward biased pn-junction voltage is added to the hold voltage of the ESD power supply clamp. This case may apply especially if for high output common-mode voltages power supply ESD clamps are used that may operate at a high power supply voltage. These clamps usually have trigger voltages that exceed the maximum voltage level that is allowed for thin-oxide devices during an ESD event.

The ESD discharge path for case (ii) comprises just the elements 118a/119a (ESD_P) and is therefore usually not critical.

The ESD discharge path for case (iii) comprises the ESD power supply clamp 111 as well as elements 118b/119b (ESD_N). Thus, a forward biased pn-junction voltage is added to the hold voltage of the ESD power supply clamp 111. This case may apply especially if for high output common-mode voltages power supply ESD clamps are used that may operate at a high power supply voltage. These clamps usually have trigger voltages that exceed the maximum voltage level that is allowed for thin-oxide devices during an ESD event.

The ESD discharge path for case (iv) comprises just the elements 118b/119b (ESD_N) and is therefore usually not critical.

The ESD discharge path for case (v) comprises the ESD power supply clamp 111, the elements 118a/119a (ESD_P) and the elements 118b/119b (ESD_N). Thus, two forward biased pn-junction voltages are added to the hold voltage of the ESD power supply clamp 111. This case may apply especially if for high output common-mode voltages power supply ESD clamps are used that can operate at a high power supply voltage. These clamps usually have trigger voltages that exceed the maximum voltage level that is allowed for thin-oxide devices during an ESD event.

It may be difficult to protect the transistors Tn/Tp by providing a discharge path through the ESD devices with sufficiently small trigger and hold voltage. Of the ESD discharge cases (i)-(v) listed above, the case (v) may be of particular relevance. In this case the discharge path incorporates two ESD elements as well as the power clamp 111, and the voltage across the transistors Tn/Tp may become significantly large.

This effect may be further reinforced in the case, when thin-oxide field effect transistors are used for Tn/Tp and a common-mode voltage is applied that exceeds the voltage limits of the devices.

In this application, the term "thin-oxide field effect transistor" is understood to mean a field effect transistor having a thin gate oxide. For example, the gate oxide thickness in a thin-oxide field effect transistor may, for example, be about 1.6 nm or less in the 90-nm technology node, or about 1.25 nm or less in the 65-nm technology node.

In the above-mentioned case, the supply voltage VDD may be relatively high, thereby necessitating the use of ESD power clamps that can tolerate higher voltages. Such a power clamp, e.g. a ggNMOS, may have a trigger voltage that exceeds the maximum allowed voltage for the thin-oxide transistors.

Another power clamp structure is given by a so-called gate controlled NMOS (gcNMOS), which is an NMOS transistor device with the gate tied to VDD through an inverter. The inverter is driven from VDD through a large resistor but the inverter input is also coupled to VSS with a large capacitance. This provides an RC filter with a time constant that exceeds the duration of an ESD event. In this way, it may be achieved that the inverter input is at VSS level during an ESD event forcing the output to go to VDD and hence the gcNMOS device to act as a NMOS diode. Also in case of a gcNMOS, still the two hold voltages of the remaining ESD elements ESD_P and ESD_N may be added. Furthermore, a significantly large voltage may be observed across the gcNMOS device due to the large ESD discharge currents. For example, at 2 kV HBM (Human Body Model), a current of about 2 A may flow.

In the generation of the control voltages Vgn/Vgp, the swing on these voltages may be adjusted to comply with the maximum voltages across Tn/Tp. Furthermore, special care may be applied during power-down to avoid significant stress on Tn/Tp when the current I0 is shut off, which forces the pin voltages to go to VDD if Vcm is tied directly to VDD. Even when Vcm is controlled with the pass circuit 120 special care may be implemented to reduce or even avoid undesirable conditions during power-down and/or power-up.

In some write driver circuits, an additional differential pair is used to derive the control voltages Vgn/Vgp.

Figure 2:
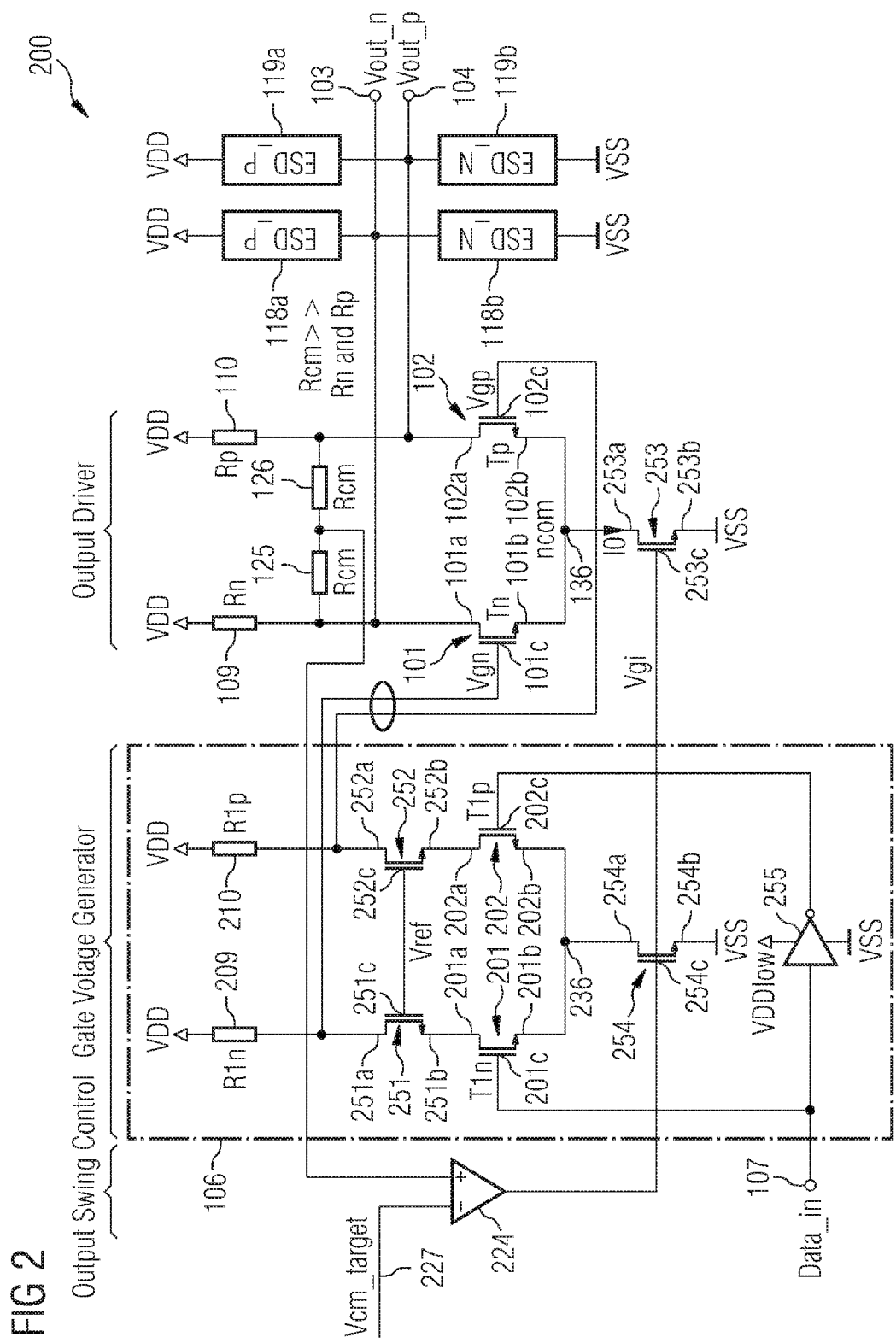
FIG. 2 shows another illustrative embodiment of a write driver circuit.

FIG. 2 shows a write driver circuit 200 that includes an additional differential pair (T1n/T1p) that is controlled by the digital input data Data_in and has a resistive load (R1n/R1p). The write driver circuit 200 is to some degree similar to the write driver circuit 100 shown in FIG. 1, and those components of the write driver circuit 200 that are similar or identical to components, which have been described herein above in context with the write driver circuit 100, will not be re-described in detail again in the interest of brevity.

The write driver circuit 200 includes a third field effect transistor 201 (labelled "T1n") and a fourth field effect transistor 202 (labelled "T1p") as the additional differential pair, and further includes a fifth field effect transistor 251 and a sixth field effect transistor 252. The third field effect transistor 201, the fourth field effect transistor 202, the fifth field effect transistor 251, and the sixth field effect transistor 252 are all configured as NMOS field effect transistors.

A source terminal 201a and a drain terminal 201b of the third field effect transistor 201 (T1n) are coupled to a drain terminal 251b of the fifth field effect transistor 251 and a node 236, respectively, and a source terminal 202a and a drain terminal 202b of the fourth field effect transistor 202 (T1p) are coupled to a drain terminal 252b of the sixth field effect transistor 252 and the node 236, respectively. A gate terminal 251c of the fifth field effect transistor 251 is coupled with a gate terminal 252c of the sixth field effect transistor 252, and a voltage Vref is provided to the gate terminals 251c, 252c of the two transistors 251 and 252.

A source terminal 251a of the fifth field effect transistor 251 is coupled with the gate terminal 101c of the first field effect transistor 101 (Tn) and is further coupled (via a third pull-up resistor 209 having a resistance R1n) with the VDD potential. Similarly, a source terminal 252a of the sixth field effect transistor 252 is coupled with the gate terminal 102c of the second field effect transistor 102 (Tp) and is further coupled (via a fourth pull-up resistor 210 having a resistance R1p) with the VDD potential.

The write driver circuit 200 further includes a seventh field effect transistor 253, which is configured as an NMOS field effect transistor. The seventh field effect transistor 253 is coupled between the node 136 and the VSS potential and clearly replaces the current source 135 shown in FIG. 1. That is, a source terminal 253a and a drain terminal 253b of the seventh field effect transistor 253 are coupled with the node 136 and the VSS potential, respectively. The write driver circuit 200 further includes an eight field effect transistor 254, which is configured as an NMOS field effect transistor. The eighth field effect transistor 254 is coupled between the node 236 and the VSS potential. That is, a source terminal 254a and a drain terminal of the eighth field effect transistor 254 are coupled with the node 236 and the VSS potential, respectively.

The seventh field effect transistor 253 and the eighth field effect transistor 254 clearly serve as tail current sources in the write driver circuit 200.

The write driver circuit 200 further includes two resistors 125, 126, each having a resistance Rcm, that are series-connected between the source terminal 101a of the first field effect transistor 101 and the source terminal 102a of the second field effect transistor 102. The value of Rcm may be much greater than the values Rn, Rp of the first and second pull-up resistors 109, 110.

The write driver circuit 200 further includes an operational amplifier 224, wherein a non-inverting input of the operational amplifier 224 is coupled midway between the two resistors 125 and 126, wherein a voltage 227 (labelled "Vcm_target") is provided at an inverting input of the operational amplifier 224, and wherein an output of the operational amplifier 224 is coupled to a drain terminal 253c of the seventh field effect transistor 253 and to a drain terminal 254c of the eight field effect transistor 254. The operational amplifier 224 provides (via the output) a voltage Vgi to the drain terminal 253c of the seventh field effect transistor 253 and to the drain terminal 254c of the eight field effect transistors 254.

The write driver circuit 200 further includes an inverter 255, wherein an input of the inverter 255 is coupled to a data input 107 of the write driver circuit 200, and an output of the inverter 255 is coupled to a gate terminal 202c of the fourth field effect transistor 202. The data input 107 is further coupled to a gate terminal 201c of the third field effect transistor 201. A data input signal "Data in" provided at the data input 107 may thus be provided to the gate terminal 201c of the third field effect transistor 201 and further to the input of the inverter 255. The VSS potential and a digital supply potential (VDDlow) are provided at a second and a third input of the inverter 255, respectively. By means of the inverter 255, a signal, which corresponds to an inversion of the data input signal "Data_in", may be provided at the gate terminal 202c of the fourth field effect transistor 202.

The first through third field effect transistors 101, 102, and 253, the first and second pull-up resistors 109, 110, and the two resistors 125, 126 are part of an output driver (labelled "Output Driver" in FIG. 2) of the write driver circuit 200, while the third through sixth field effect transistors 201, 202, 251, and 252, the eighth field effect transistor 254, the third and fourth pull-up resistors 209, 210, and the inverter 255 clearly serve as a gate voltage generator 106 (labelled "Gate Voltage Generator" in FIG. 2) that provides gate voltages Vgn and Vgp to the gate terminals 101c, 102c of the driver transistors 101 and 102 of the output driver. The operational amplifier 224 may serve to control the output swing of the write driver circuit 200, as is indicated by a label "Output Swing Control" in FIG. 2.

In the write driver circuit 200, the first through sixth field effect transistors 101, 102, 201, 202, 251, and 252 are configured as thin-oxide devices. The seventh field effect transistor 253 and the eighth field effect transistor 254 are configured as thick-oxide devices. In the context of this application, the term "thick-oxide field effect transistor" is understood to mean a field effect transistor having a thick gate oxide, for example with a gate-oxide thickness in the range from about 5 nm to about 8 nm or more.

Clearly, FIG. 2 shows a write driver circuit design with a gate voltage generator and an output swing adjustment through common-mode control but without a pass-circuit for common-mode reduction (i.e., Vcm=VDD).

In the following, certain features and properties of the write driver circuit 200 will be described in more detail.

In the writer driver circuit 200, the additional differential pair T1n/T1p may also be endangered as the load resistors R1n/R1p usually are tied to VDD (or Vcm where applicable). Thus, the transistors 201 (T1n) and 202 (T1p) may also face a high voltage. The differential pair T1n/T1p is driven by the input data ("Data_in") and the inverted input data. The digital input signal may have a lower voltage swing as determined by the digital supply voltage VDDlow of the system. For an optimum symmetrical behavior, the operating point at the gates 201c, 202c of the second differential pair T1n/T1p should be low enough to avoid cross-over distortion when data polarity changes. The bandwidth of the gate voltage generator 106 should be high enough to avoid affecting the output signal asymmetry. This may be relevant in high-speed designs as the differential pair Tn/Tp usually may be very large to handle the large currents that are flowing in the output stage, for example when a high signal swing is used and/or high data rates are processed. In this situation, the pull-up resistors Rn/Rp may be very small, e.g. less than about 20Ω. To increase the bandwidth, the output impedance of the gate voltage generator 106 may also be low in order to drive the large capacitive load provided by the gates of the differential pair Tn/Tp. This may cause the current consumption of the circuit 200 to increase.

The output signal swing may be controlled by adjusting the tail current I0 in the output driver. This may be done by controlling the common-mode voltage at the output pins 103, 104. For this purpose, a common-mode target voltage Vcm_target relative to VDD may be applied and the swing may be adjusted by altering the gate voltage Vgi of the tail current sources 253 and 254. Processing variations of the resistor values may thereby be compensated. The target voltage Vcm target may, for example, be obtained by buffering a bandgap reference voltage (that references to VSS) via an operational amplifier (OpAmp) and an NMOS transistor on a first resistance to VSS, and letting the current that flows through the NMOS transistor flow into a second resistance that goes to VDD. Thus, a target voltage is obtained relative to VDD. The value by which the target voltage is offset to VDD is determined by the ratio between the second and first resistances times the reference voltage, e.g. a bandgap voltage, provided to the operational amplifier input.

Certain properties of write driver circuits that operate at a high output common-mode voltage, are:

ESD protection of the output differential pairs may be difficult to achieve;

ESD protection devices, including the power clamps, may need to withstand high voltages under normal operation when a high common-mode output voltage is targeted;

ESD devices for high DC voltage operation may not be suited to protect low-voltage thin-oxide output devices;

ESD clamps may add to the parasitic capacitance;

A thin-oxide differential pair connected to the pins may need a special ESD layout to cope with possible currents flowing during differential pin-to-pin ESD stress. This layout may increase the parasitic capacitance;

A large device size of the differential pair Tn/Tp may be needed to cope with high tail currents used for large output signal swings. This may increase the device area and thus the parasitic capacitance due to the dedicated ESD layout;

A complicated gate-voltage control circuit may be needed to maintain the transistor voltages of the differential pair Tn/Tp within given process limits;

An ESD protection of the gate-voltage control circuit on its own may be a difficult task to perform due to the thin-oxide devices that are operated at the high supply voltage;

Power-up and power-down stress may apply to the thin-oxide devices due to the operation at the high supply voltage;

A high-speed operation may be compromised by a pole at the output of the gate voltage generator.

In accordance with some embodiments, write driver circuits and corresponding manufacturing methods are provided that achieve a high ESD robustness in the circuit while the parasitic capacitance at the pins is minimized using only standard functional devices and standard ESD devices. For example, in accordance with some embodiments, standard thick-oxide transistors are used as driver devices and may be operated at predetermined high supply and/or common-mode voltages without exceeding maximum voltage ratings.

In accordance with some embodiments, a new ESD protection concept is provided that is based on the self-protection of thick-oxide transistors during an ESD event by using a sufficiently large device width and implementing a special ESD layout. A thick-oxide field effect transistor is understood to mean a field effect transistor having a thick gate oxide. For example, the thickness of the gate oxide in a thick-oxide field effect transistor may be in the range from about 5 nm to about 8 nm in accordance with some embodiments, for example from about 6 nm to 7 nm in accordance with some embodiments, e.g. about 5.2 nm in one embodiment, for example in the 90-nm technology node. In accordance with some embodiments, a thick-oxide field effect transistor may be understood as a field effect transistor that may handle voltages above approximately 1.8 V, in other words, a field effect transistor, in which the drain-to-source voltage may exceed about 1.8 V. In comparison thereto, the gate-oxide thickness in a thin-oxide field effect transistor may be, for example, about 1.6 nm in the 90-nm technology node, or about 1.25 nm in the 65-nm technology node.

An ESD protection mechanism used in accordance with some embodiments includes the parasitic NPN device in parallel to an NMOS that may trigger at a sufficiently lower voltage compared to the oxide breakdown voltage. For example, when using thick-oxide NMOS types with e.g. 5.2 nm oxide thickness in accordance with one embodiment, the oxide breakdown voltage may be about 9 V while the source-to-drain breakdown voltage may be in the range from about 5 V to about 6 V.

In accordance with some embodiments, any additional ESD protection elements may be spared, or may be used to increase the ESD robustness of a write driver circuit even further, in accordance with alternative embodiments.

FIG. 3 shows a write driver circuit 300 in accordance with an illustrative embodiment.

The write driver circuit 300 includes a first field effect transistor 301 (labelled "Tn"). The first field effect transistor 301 includes a first source/drain terminal 301a coupled to a first output 303, a second source/drain terminal 301b coupled with a reference potential 305 (for example, a lower supply potential, e.g. VSS, or the ground potential (GND)), and a gate terminal 301c.

The write driver circuit 300 further includes a second field effect transistor 302 (labelled "Tp"). The second field effect transistor 302 includes a first source/drain terminal 302a coupled to a second output 304, a second source/drain terminal 302b coupled with the reference potential 305, and a gate terminal 302c.

In accordance with an embodiment, the first field effect transistor 301 and the second field effect transistor 302 may be configured as self-protected field effect transistors. In accordance with another embodiment, the first field effect transistor 301 and the second field effect transistor 302 may be configured as thick-oxide field effect transistors.

The write driver circuit 300 further includes a gate voltage generator 306 (labelled "Vgate Generator") coupled to the gate terminals 301c, 302c of the first and second field effect transistors 301, 302. In accordance with an embodiment, the gate voltage generator 306 may be configured to provide a gate voltage to the gate terminals 301c, 302c of the first and second field effect transistors 301, 302 such that the first and second field effect transistors 301, 302 are operated in saturation when enabled. In other words, the gate voltage generator 306 may be configured to provide a gate voltage to the gate terminals 301c, 302c of the first and second field effect transistors 301, 302 such that the first and second field effect transistors 301, 302 are operated in a current source mode when enabled.

In accordance with another embodiment, the gate voltage generator may include at least one device, the at least one device being configured as a minimal feature size device. In this context, a minimal feature size device may, for example, be understood as a device that is based on or uses the smallest or minimal structure size (or feature size) that is used on a chip, e.g. on a chip on which the write driver circuit is formed. In other words, a minimal feature size device may feature the smallest structure size used on the chip.

In accordance with an embodiment, the first field effect transistor 301 and/or the second field effect transistor 302 may be configured as NMOS field effect transistor (n-type metal oxide semiconductor), as shown in FIG. 3. Alternatively, one or both of the field effect transistors 301, 302 may be configured as PMOS field effect transistor (p-type metal oxide semiconductor).

In accordance with another embodiment, the write driver circuit 300 may further include a first load device 309 coupled between the first source/drain terminal 301a of the first field effect transistor 301 and a second reference potential 308 (for example, an upper supply potential, e.g. VDD), and a second load device 310 coupled between the first source/drain terminal 302a of the second field effect transistor 302 and the second reference potential 308 (as shown in FIG. 3).

In accordance with one embodiment, at least one of the first and second load devices 309, 310 may include a resistor (as shown in FIG. 3), for example with an electrical resistance from about 10Ω to about 20Ω. In accordance with another embodiment, at least one of the first and second load devices 309, 310 may include a plurality of resistors electrically connected in parallel to one another (not shown in FIG. 3, cf. FIG. 6).

Figure 6:
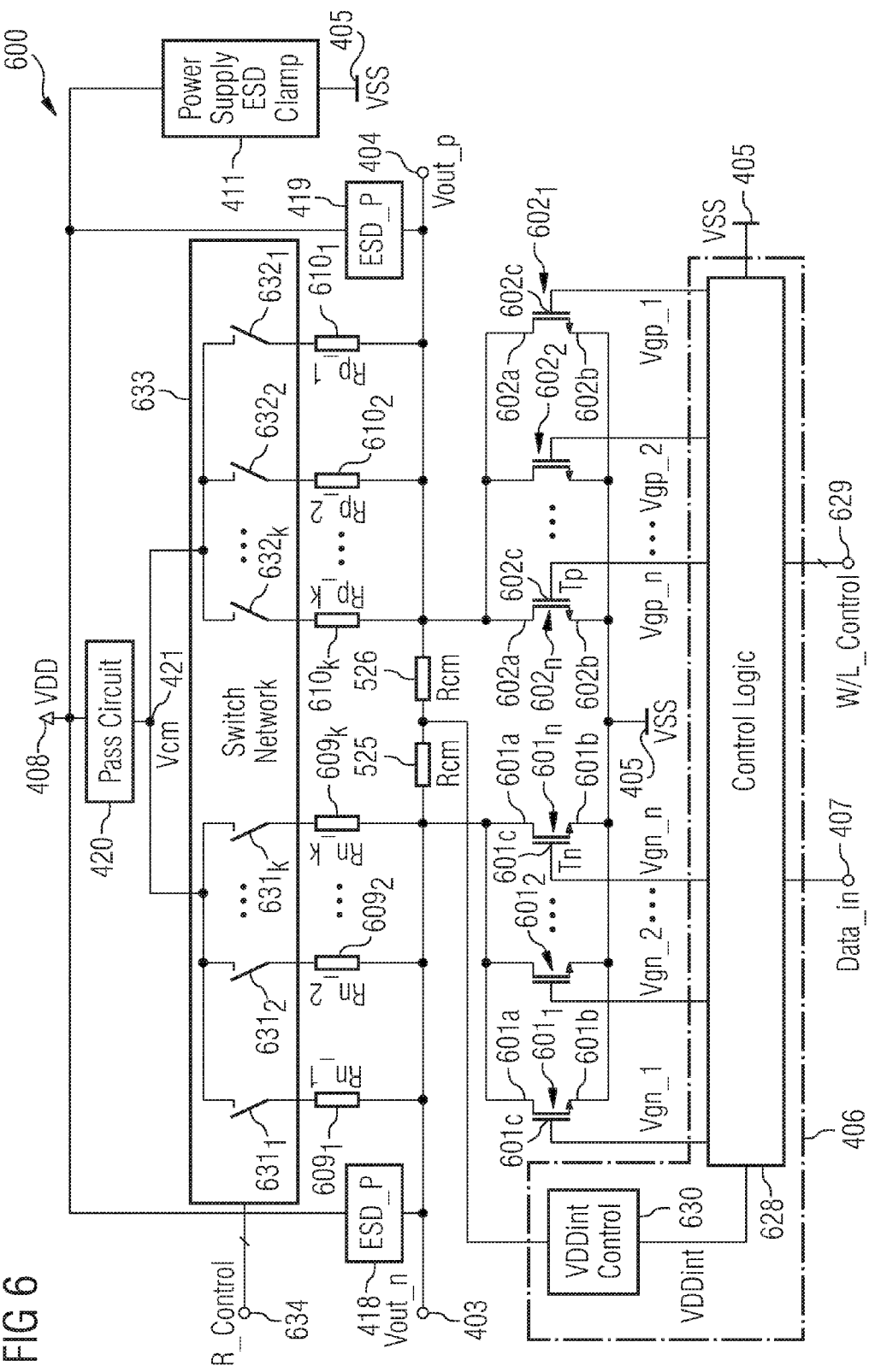
FIG. 6 shows another illustrative embodiment of a write driver circuit.

In accordance with another embodiment, the write driver circuit 300 may further include a switch network for selectively enabling one or more of the plurality of resistors, the switch network including a plurality of switches, wherein in each case one switch is connected in series with one resistor of the plurality of resistors (not shown in FIG. 3, cf. FIG. 6

Figure 4A:
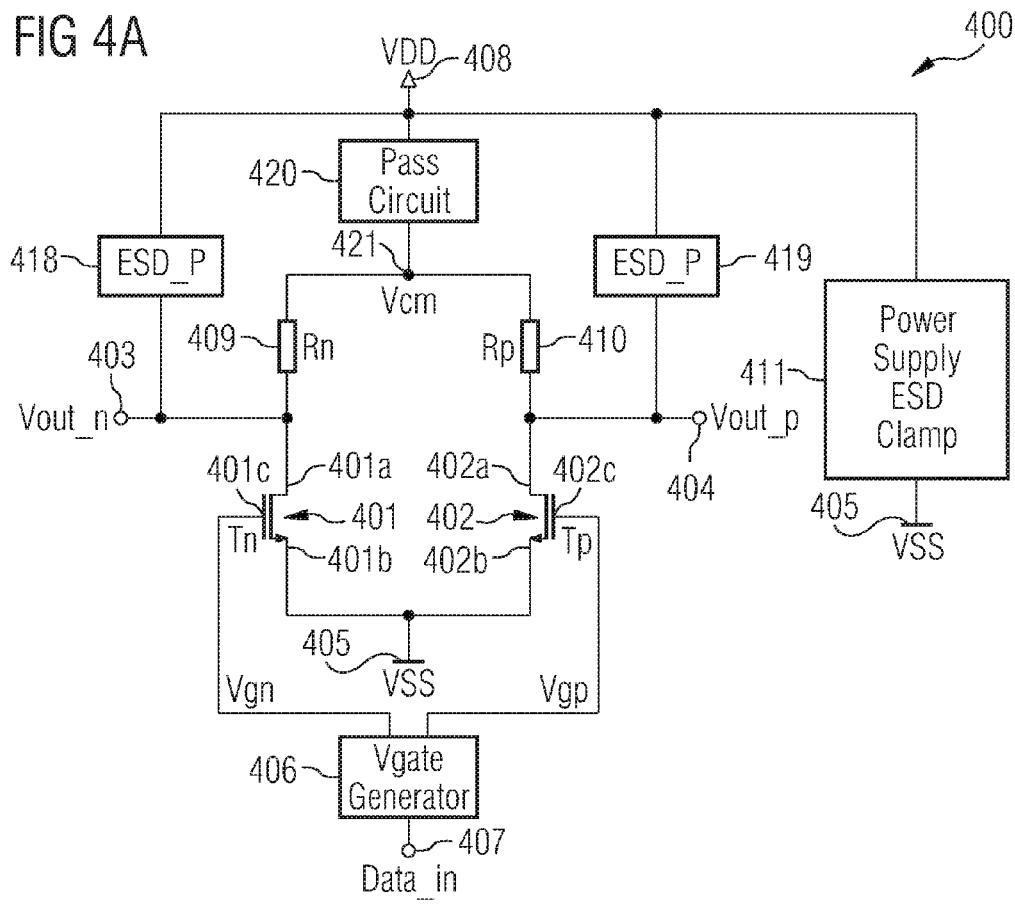
FIG. 4A shows another illustrative embodiment of a write driver circuit.

In accordance with another embodiment, the write driver circuit 300 may further include a clamp device coupled between the reference potential 305 and the second reference potential 308 (not shown in FIG. 3, cf. FIG. 4A). In accordance with one embodiment, the clamp device may be configured as a grounded gate NMOS (ggNMOS) field effect transistor (not shown in FIG. 3, cf. FIG. 4B). In accordance with another embodiment, the clamp device may be configured as a gate controlled NMOS (gcNMOS) field effect transistor (not shown in FIG. 3, cf. FIG. 4C). Alternatively, the clamp device may be configured as another suitable clamp device. Clearly, the clamp device coupled between the two reference potentials may serve as a power supply ESD clamp.

In accordance with another embodiment, the write driver circuit 300 may further include a clamp device coupled between the second reference potential 308 and the first source/drain terminal 301a of the first field effect transistor 301 (not shown in FIG. 3, cf. FIG. 4A).

In accordance with another embodiment, the write driver circuit 300 may further include a clamp device coupled between the second reference potential 308 and the first source/drain terminal 302a of the second field effect transistor 302 (not shown in FIG. 3, cf. FIG. 4A).

In accordance with another embodiment, the write driver circuit 300 may further include a pass circuit coupled between the second reference potential 308 and the first and second load devices 309, 310 (not shown in FIG. 3, cf. FIG. 4A).

Figure 5:
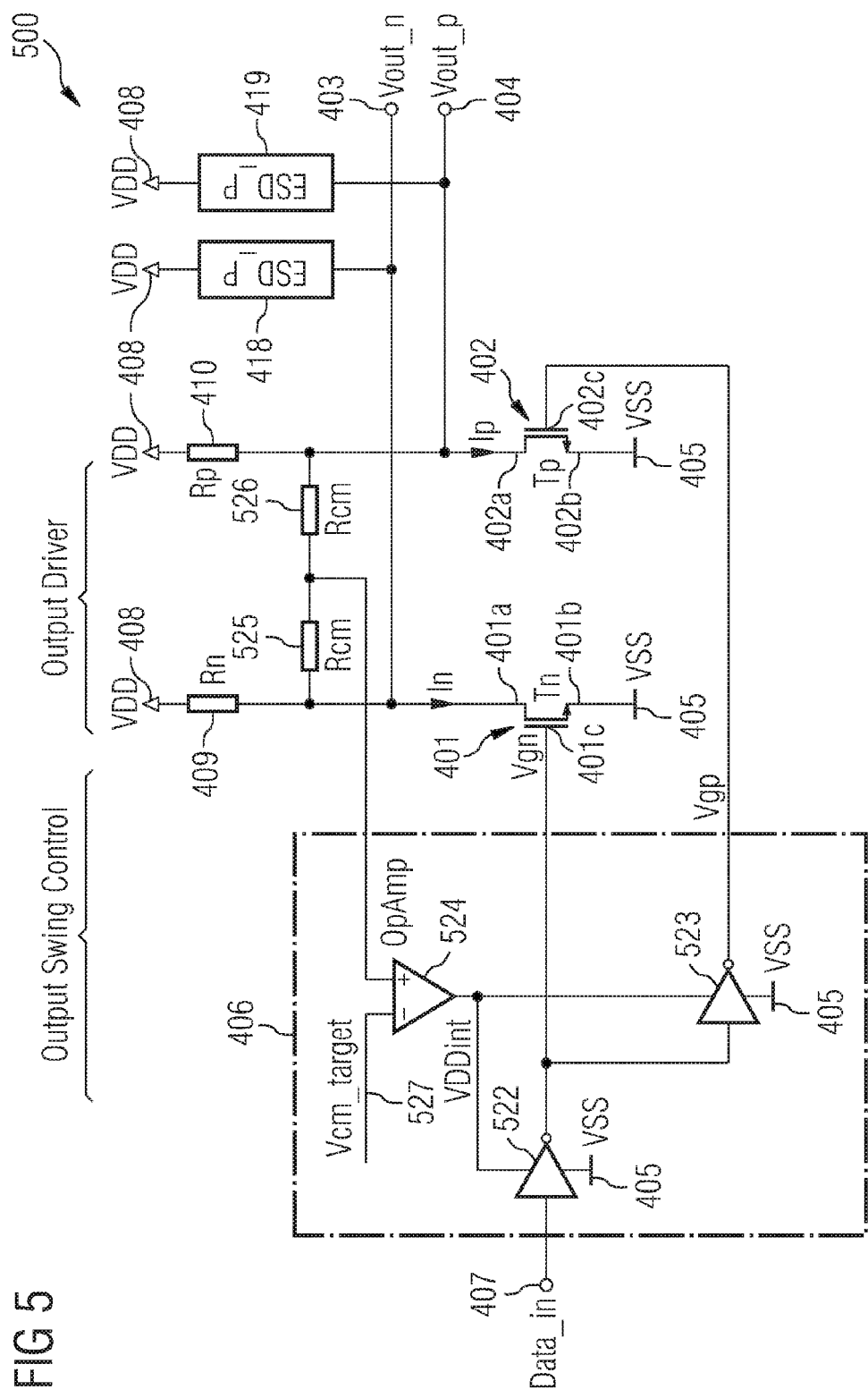
FIG. 5 shows an illustrative embodiment of a write driver circuit.

In accordance with another embodiment, the gate voltage generator 306 may include a control circuit coupled to the first source/drain terminals 301a, 302a and to the gate terminals 301c, 302c of the first and second field effect transistors 301, 302, wherein the control circuit comprises a feedback loop to establish a predetermined common-mode voltage at the first and second outputs 303, 304 (not shown in FIG. 3, cf. FIG. 5).

In accordance with an embodiment, the control circuit may include a first inverter, a second inverter and an operational amplifier, wherein a first input of the first inverter is coupled to a data input and an output of the first inverter is coupled to the gate terminal 301c of the first field effect transistor 301, wherein a first input of the second inverter is coupled to the output of the first inverter and an output of the second inverter is coupled to the gate terminal 302c of the second field effect transistor 302, wherein a non-inverting input of the operational amplifier is coupled between the first source/drain terminal 301a of the first field effect transistor 301 and the first source/drain terminal 302a of the second field effect transistor 302, wherein a predetermined voltage is provided at an inverting input of the operational amplifier, and wherein an output of the operational amplifier is coupled to a second input of the first inverter and to a second input of the second inverter.

In accordance with another embodiment, at least one of the first and second field effect transistors 301, 302 may be configured in such a manner that the W/L ratio of that transistor is in the range from about 800 to about 1200. In the context of this application, the term "W/L ratio" is understood to mean the ratio between the device width (W) and the device length (L). For example, in the context of a field effect transistor the device length (L) may be understood to refer to the distance of the two source/drain regions from one another, and the device width (W) may refer to the dimension of the transistor gate in the direction perpendicular to the device length and in the main processing plane.

In accordance with some embodiments, at least one of the first and second field effect transistors 301, 302 may have a device length in the range from about 180 nm to about 400 nm, e.g. 240 nm in accordance with one embodiment, and/or a device width in the range from about 100 μm to about 300 μm, e.g. 200 μm in accordance with one embodiment.

In case that the first field effect transistor 301 and the second field effect transistor 302 are configured as thick-oxide field effect transistors, in accordance with one embodiment, at least one of the field effect transistors 301 and 302 may have a gate oxide with such a thickness that a snap-back voltage (in other words, a trigger voltage) of the field effect transistor, for example of a parasitic bipolar device of the field effect transistor (e.g., of a parasitic NPN device in case that the field effect transistor is configured as an NMOS field effect transistor) is lower than a breakdown voltage of the gate oxide. In accordance with some embodiments, the gate oxide may have a thickness in the range from about 5 nm to about 8 nm, for example from about 6 nm to about 7 nm according to some embodiments, e.g. about 5.2 nm in one embodiment.

In accordance with another embodiment, at least one of the at least one first field effect transistor 301 and the at least one second field effect transistor 302 may be configured as a plurality of field effect transistors electrically connected in parallel to one another (not shown in FIG. 3, cf. FIG. 6).

In accordance with another embodiment, the gate voltage generator 306 may include a control logic for selectively enabling one or more of the plurality of parallel field effect transistors (not shown in FIG. 3, cf. FIG. 6).

With reference now to FIG. 4A, a write driver circuit 400 in accordance with another illustrative embodiment will be described below.

The write driver circuit 400 includes a first field effect transistor 401 (labelled "Tn" in FIG. 4A). The first field effect transistor 401 includes a first source/drain terminal 401a coupled to a first output 403, a second source/drain terminal 401b coupled with a reference potential 405, and a gate terminal 401c. In accordance with the embodiment shown, the reference potential 405 is a VSS potential, that is, a lower electrical supply potential. In accordance with another embodiment, the reference potential may, for example, be the ground (GND) potential.

The write driver circuit 400 further includes a second field effect transistor 402 (labelled "Tp" in FIG. 4A). The second field effect transistor 402 includes a first source/drain terminal 402a coupled to a second output 404, a second source/drain terminal 402b coupled with the reference potential 405, and a gate terminal 402c.

The first field effect transistor 401 and the second field effect transistor 402 are configured as self-protected thick-oxide field effect transistors.

The write driver circuit 400 further includes a gate voltage generator 406 that is coupled to the gate terminals 401c, 402c of the first and second field effect transistors 401, 402. The gate voltage generator 406 is configured to provide a gate voltage Vgn to the gate terminal 401c of the first effect transistor 401, and a gate voltage Vgp to the gate terminal 402c of the second field effect transistor 402. The gate voltages Vgn, Vgp are provided to the gate terminals 401c, 402c such that the first and second field effect transistors 401, 402 are operated in a current source mode when enabled.

The gate voltage generator 406 is coupled to a data input 407, at which a data input signal ("Data_in") may be provided. The data input signal "Data_in" may be a digital input signal.

The first field effect transistor 401 and the second field effect transistor 402 are configured as NMOS field effect transistors. Alternatively, one or both of the field effect transistors 401, 402 may be configured as a PMOS field effect transistor.

The write driver circuit 400 further includes a first load device 409 coupled (via a pass circuit 420, see below) between the first source/drain terminal 401a of the first field effect transistor 401 and a second reference potential 408. In accordance with the embodiment shown, the second reference potential is a VDD potential, that is, a higher electrical supply potential.

The write driver circuit 400 further includes a second load device 410 coupled (via the pass circuit 420, see below) between the first source/drain terminal 402a of the second field effect transistor 402 and the second reference potential 408.

The first load device 409 is configured as a first resistor having an electrical resistance Rn, and the second load device 410 is configured as a second resistor having an electrical resistance Rp. Clearly, the first and second resistors 409, 410 may serve as pull-up resistors in the write driver circuit 400.

In accordance with one embodiment, the first resistor and/or the second resistor may have an electrical resistance from about 10Ω to about 20Ω. In other embodiments, the first and second resistors may have other values of the electrical resistance.

The write driver circuit 400 further includes a clamp device 411 coupled between the reference potential 405 and the second reference potential 408. The clamp device 411 may serve as a power supply ESD clamp.

Figure 4B:
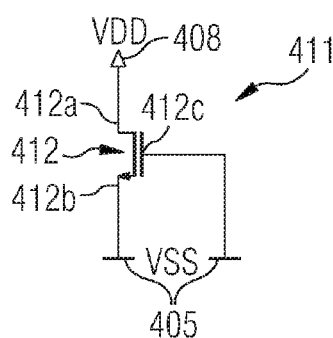
FIG. 4B and FIG. 4C show illustrative embodiments of clamp devices for use in a write driver circuit.

In accordance with one embodiment, the clamp device 411 may be configured as a grounded gate NMOS field effect transistor (ggNMOS) as is shown in FIG. 4B. In this case, the clamp device 411 includes an NMOS field effect transistor 412, wherein a first source/drain terminal 412a of the field effect transistor 412 is coupled with the second reference potential 408 (upper supply potential VDD), and a second source/drain terminal 412b and the gate terminal 412c of the field effect transistor 412 are coupled with the reference potential 405 (lower supply potential VSS).

Figure 4C:
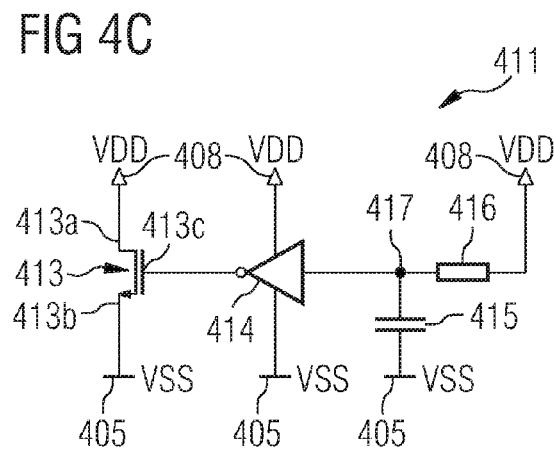

FIG. 4C shows a clamp device 411 (power supply ESD clamp) that is configured as a gate controlled NMOS field effect transistor, in accordance with another embodiment. In accordance with this embodiment, the clamp device 411 includes an NMOS field effect transistor 413, an inverter 414, a capacitance 415 (e.g., a capacitor), and a resistance 416 (e.g., a resistor). A first source/drain terminal 413a of the field effect transistor 413 is coupled with the second reference potential 408 (upper supply potential VDD), and a second source/drain terminal 413b of the field effect transistor 413 is coupled with the reference potential 405 (lower supply potential VSS). The resistance 416 is coupled between the second reference potential 408 and an input of the inverter 414. In other words, a first terminal of the resistance 416 is coupled with the second reference potential 408, and a second terminal of the resistance 416 is coupled to the input of the inverter 414. The capacitance 415 is coupled between the reference potential 405 and an electrical node 417 located between the resistance 416 and the input of the inverter 414. In other words, a first terminal of the capacitance 415 is coupled with the reference potential 405, and a second terminal of the capacitance 415 is coupled to the input of the inverter 414 and to the second terminal of the resistance 416. An output of the inverter 414 is coupled with the gate terminal 413c of the field effect transistor 413. Furthermore, the reference potential 405 and the second reference potential 408 are provided at a second and a third input of the inverter 414, respectively.

Clearly, the clamp device 411 in accordance with the embodiment shown in FIG. 4C is configured as a gate controlled NMOS (gcNMOS), that is as an NMOS transistor 413 with its gate 413c tied to VDD through the inverter 414. The inverter 414 is driven from VDD through the resistor 416 and the first input of the inverter 414 is further coupled to VSS with a capacitance 415. This may provide an RC filter with a time constant exceeding, for example, 100 ns and thereby the duration of an ESD event. Thus, it may be achieved that the inverter input is at VSS level during an ESD event forcing the output to go to VDD and hence the gcNMOS device to act as an NMOS diode.

In accordance with alternative embodiments, other devices or circuits than the ones shown in FIG. 4B and FIG. 4C may be used as power supply ESD clamp 411 in the write driver circuit 400 (in general, in a write driver circuit in accordance with an illustrative embodiment).

The write driver circuit 400 further includes a second clamp device 418 (labelled "ESD_P") coupled between the second reference potential 408 and the first source/drain terminal 401a of the first field effect transistor 401. In other words, a first terminal of the second clamp device 418 is coupled with the second reference potential 408, and a second terminal of the second clamp device 418 is coupled with the first output 403 and to the first source/drain terminal 401a of the first field effect transistor 401.

The write driver circuit 400 further includes a third clamp device 419 (labelled "ESD_P") coupled between the second reference potential 408 and the first source/drain terminal 402a of the second field effect transistor 402. In other words, a first terminal of the third clamp device 419 is coupled with the second reference potential 408, and a second terminal of the third clamp device 419 is coupled with the second output 404 and to the first source/drain terminal 402a of the second field effect transistor 402.

The clamp devices 418 and 419 are optional devices that may be configured to provide a bypass for discharge currents in an ESD event. In accordance with one embodiment, at least one of the clamp devices 418, 419 may be configured as a pn-diode. In this case, the clamp device may clamp the pin voltage (that is, the voltage Vout_n at the first output 403 or the voltage Vout_p at the second output 404) against VDD by forward biasing the pn-diode. In accordance with alternative embodiments, other suitable clamp devices may be used for the second and third clamp devices 418, 419.

The write driver circuit 400 further includes a pass circuit 420 coupled between the second reference potential 408 and the first and second load devices 409, 410. In other words, a first terminal of the pass circuit 420 is coupled with the second reference potential 408, while a second terminal of the pass circuit 420, a first terminal of the first load device 409 and a first terminal of the second load device 410 are coupled to a common electrical node 421, with a second terminal of the first load device 409 being coupled to the first source/drain terminal 401a of the first field effect transistor 401 and a second terminal of the second load device 410 being coupled to the first source/drain terminal 402a of the second field effect transistor 402.

The pass circuit 420 is an optional device or circuit that may be configured to set or regulate a common-mode voltage level Vcm at the common node 421, to which the first and second load devices 409, 410 are connected. In other words, the pass circuit 420 may be used to establish a common-mode voltage at the first and second outputs 403, 404 that is not related to the differential output swing of the write driver circuit 400. In accordance with an embodiment, the pass circuit 420 may be configured to achieve a common-mode voltage level Vcm at the node 421 that may be lower than the second reference potential 420 (that is, lower than VDD). In accordance with another embodiment, the pass circuit 420 may be a short to the second reference potential 408 so that Vcm=VDD in this case. Alternatively, the pass circuit 420 may be omitted and the first and second load devices 409, 410 may be coupled directly with the second reference potential 408.

In the following, certain features and properties of the write driver circuit 400 will be described in more detail.

Clearly, the write driver circuit 400 shown in FIG. 4A uses self-protected open-drain drivers. In particular, instead of using a differential pair (as in write drivers such as the one shown in FIG. 1), a thick-oxide NMOS open-drain driver pair Tn/Tp (first and second field effect transistors 401, 402) is used in the write driver circuit 400, and may be controlled by a gate voltage generator 406 that provides differential voltages Vgn and Vgp to the gate terminals 401c, 402c of the driver transistors 401, 402 in such a manner that the current flowing through Tn/Tp may be controlled to achieve a predetermined signal swing across the pull-up resistors Rn/Rp.

In a differential pair write driver the common source of the pair (e.g. node 136 ("ncom") shown in FIG. 1), is connected to VSS through a current source (e.g. current source 135 shown in FIG. 1). Therefore it is not possible to achieve a direct bypass from pin to VSS using the parasitic parallel NPN transistor.

In the open-drain circuit 400 shown in FIG. 4A, the parasitic NPN device is connected between the pins and VSS such that a low-ohmic discharge path is possible. The discharge path may work in both directions, i.e. voltages that are lower than VSS may be clamped by the bulk diodes of the transistors Tn/Tp, and pin voltages exceeding the trigger point of the parasitic NPN (the snap-back voltage) may also be clamped to VSS.

Any ESD stress event appearing between the pins and VSS (that is, pin voltage positive against VSS or vice versa) may be handled by the write driver circuit 400.

In addition, any differential ESD stress event appearing between the pins (that is, Vout_n positive against Vout_p or vice versa) may also be handled by the write driver circuit 400. One of the field effect transistor devices 401, 402 is then operating in snap-back mode and the other one with its bulk-diode forward biased.

Furthermore, any ESD stress event appearing between VDD and the pins (that is, pin voltage positive against VDD or vice versa) is covered by including the power clamp 411 (e.g. ggNMOS power clamp). A stress event wherein VDD is positive against a pin may discharge through the power clamp 411 operated in snap-back mode and the bulk diode of either the first field effect transistor 401 (Tn) or the second field effect transistor 402 (Tp), depending on which pin is stressed. When a pin is positive against VDD the snap-back may occur in either the first field effect transistor 401 (Tn) or the second field effect transistor (Tp), and the power clamp 411 may operate as an NMOS diode between VSS and VDD.

One effect of the write driver circuit 400 is that additional ESD clamps at the pins are not necessary, for example, in case that the pass circuit 420 is provided and provides a short to VDD and the resistor layout can handle the current that is determined by the hold voltage of the series connection of the ggNMOS power clamp (in diode mode) and the NMOS (either Tn or Tp) operated in snap-back. A trade-off may, for example, be achieved between the resistor parasitic capacitance and the parasitic capacitance of an additional ESD_P clamp, e.g. a pn-diode junction capacitance.

In an alternative embodiment, where a pass circuit 420 is provided to lower the common-mode voltage, ESD_P clamps 418 and/or 419 may optionally be implemented, for example adapted to the design of the pass circuit 420.

Another effect of the write driver circuit 400 is that the use of thick-oxide transistors Tn and Tp, although having a slightly larger size compared to thin-oxide transistors used as differential pair in write drivers, does not cause a significant increase of the parasitic capacitance, as, in accordance with some embodiments, the transistor dimensions may already be relatively large to handle the relatively large currents that may be used to achieve a sufficient signal swing at the small pull-up resistors used for a high-speed operation of the circuit.

With reference now to FIG. 5, a write driver circuit 500 in accordance with another illustrative embodiment will be described below. In the interest of brevity, elements of the write driver circuit 500 that are the same as in the write driver circuits 300 and 400 described hereinabove, will not be described in detail again.

In the write driver circuit 500, the gate voltage generator 406 includes a control circuit (labelled "Output swing control") coupled to the first source/drain terminals 401a, 402a and to the gate terminals 401c, 402c of the first and second field effect transistors 401, 402, wherein the control circuit comprises a feedback loop to establish a predetermined common-mode voltage at the first and second output 403, 404 that is related to the differential output swing of the write driver circuit 500.

The control circuit includes a first inverter 522, a second inverter 523 and an operational amplifier 524 (labelled "OpAmp"). A first input of the first inverter 522 is coupled to the data input 407, and an output of the first inverter 522 is coupled to the gate terminal 401c of the first field effect transistor 401. A first input of the second inverter 523 is coupled to the output of the first inverter 522, and an output of the second inverter 523 is coupled to the gate terminal 402c of the second field effect transistor 402. A non-inverting input of the operational amplifier 524 is coupled between the first source/drain terminal 401a of the first field effect transistor 401 and the first source/drain terminal 402a of the second field effect transistor 402. Clearly, two electrical resistances 525, 526, each having a resistance Rcm (for example, two resistors each having a resistance Rcm), are series-connected between the first source/drain terminal 401a of the first field effect transistor 401 and the first source/drain terminal 402a of the second field effect transistor 402, and the non-inverting input of the operational amplifier 524 is coupled midway between the two resistances 525 and 526.

In accordance with some embodiments, the value of the resistances 525, 526 may be in the range from about 10 kΩ to about 50 kΩ, for example 10 kΩ in one embodiment Furthermore, a predetermined voltage 527 (labelled "Vcm_target") is provided at an inverting input of the operational amplifier 524. Clearly, the voltage 527 may correspond to a common-mode target voltage as described hereinbelow in more detail. The target voltage target may, for example, be obtained by buffering a bandgap reference voltage (that references to VSS) via an operational amplifier (OpAmp) and an NMOS transistor on a first resistance to VSS, and letting the current that flows through the NMOS transistor flow into a second resistance that goes to VDD (or to a reference potential such as the node 421 labelled Vcm in FIG. 4A). Thus, a target voltage may be obtained relative to VDD. The value by which the target voltage is offset to VDD may be determined by the ratio between the second and first resistances times the reference voltage, e.g. a bandgap voltage, provided to the operational amplifier input. An output of the operational amplifier 524 is coupled to a second input of the first inverter 522 and to a second input of the second inverter 523. Furthermore, a third input of the first inverter 522 and a third input of the second inverter 523 are in each case coupled with the reference potential 405 (for example, a lower electrical supply potential, e.g. VSS). An internal supply voltage VDDint (provided at the output of the operational amplifier 524) and the reference potential 405 are provided at a second and a third input of the inverters 522, 523, respectively.

In the write driver circuit 500, the pull-up resistances 409, 410 are coupled directly with the second reference potential 408 (that is, VDD) with no pass circuit coupled in-between, so that Vcm=VDD in this case. As in the write driver circuit 400 shown in FIG. 4A, the clamp devices 418 and 419 ("ESD_P") coupled between the outputs 403, 404 and the second reference potential are optional devices and may thus be omitted in accordance with alternative embodiments.

In accordance with another embodiment, the write driver circuit 500 may include a clamp device (power supply ESD clamp) coupled between the reference potential 405 and the second reference potential 408 in a similar manner as is illustrated and described in connection with the write driver circuit 400 shown in FIG. 4A.

In the following, certain features and properties of the write driver circuit 500 will be described in more detail.

Clearly, in accordance with the embodiment shown in FIG. 5, a write driver circuit design with self-protected thick-oxide NMOS open-drain drivers and an output swing control circuit but without a pass circuit is illustrated.

In addition to the output open-drain driver and the optional ESD_P clamps the write driver circuit 500 includes an operational amplifier 524 which may be used to adjust the output signal swing. The open drain driver transistors 401 (Tn) and 402 (Tp) may be turned on alternately such that the transistor currents In/Ip are either 0 or a predeterminable target value I0. The gate control voltages Vgn and Vgp provided to the gate terminals 401c, 402c of the driver transistors 401, 402 by the gate voltage generator 406 may toggle between VSS (0 V) and VDDint. To operate the circuit 500 at a high common-mode voltage the currents In/Ip flowing in transistors Tn/Tp may be controlled in such a manner that the swing is set to a predeterminable level, in accordance with some embodiments.

In accordance with some embodiments, the transistors Tn and Tp operate in saturation and hence may have a high output impedance. Therefore, they may be considered as current sources. In other words, each of the first and second field effect transistors 401, 402 operates in a current source mode when enabled. The internal supply voltage VDDint may be controlled by means of a feedback loop including the operational amplifier (OpAmp) 524 in such a manner, that a given common-mode target voltage Vcm target, which may be pinsportional to the signal swing, may be established at the pins.

In accordance with some embodiments, VDDint may be controlled in such a manner that it does not exceed the input data stream Data_in signal swing, which may be equal to a digital supply VDDlow. In accordance with one embodiment, this may be achieved by a suitable adjustment of the size of Tn and Tp. In this case, any regular logic (inverter, logic gates etc.) controlled by digital signals that swing with the digital supply VDDlow may be used to switch VDDint to the gates of Tp/Tn, i.e. to set the gate voltage Vgn/Vgp equal to VDDint when the transistor should be turned on.

One effect of the write driver circuit 500 is that an arbitrary common-mode voltage may be achieved at the outputs because the driver transistors Tn/Tp are operated as current sources. A pass circuit may be used in accordance with some embodiments, to lower node Vcm to which both resistors are connected and still maintain low-ohmic pull-up resistors Rp and Rn that connect to node Vcm (cf. pass circuit 420 and node 421 in FIG. 4A). In accordance with one embodiment, this circuit may be operated independently of the VDDint control loop. In accordance with another embodiment, the level Vcm may also be changed if Vcm_target is given with respect to Vcm. In accordance with one embodiment, the pass circuit may have a very low output impedance to avoid signal cross-over distortions when switching from one branch to the other. In accordance with another embodiment, a decoupling capacitance may be provided at node Vcm.

With reference now to FIG. 6, a write driver circuit 600 in accordance with another illustrative embodiment will be described below. In the interest of brevity, elements of the write driver circuit 600 that are the same as in the write driver circuits 300, 400, and 500 described hereinabove, will not be described in detail again.

The write driver circuit 600 includes a plurality of first field effect transistors $601_1, 601_2, \ldots, 601_n$ electrically connected in parallel to one another, as well as a plurality of second field effect transistors $602_1, 602_2, \ldots, 602_n$ electrically connected in parallel to one another. In other words, in the write driver circuit 600 the single first field effect transistor 401 is replaced by n (n being a natural number) first field effect transistors $601_1, 601_2, \ldots, 601_n$ each having a first source/drain terminal 401a and a second source/drain terminal 401b, wherein the first source/drain terminals 401a of the first field effect transistors $601_1, 601_2, \ldots, 601_n$ are all coupled to the first output 403 and the second source/drain terminals 401b are all coupled to the reference potential 405. Similarly, the single second field effect transistor 402 is replaced by n second field effect transistors $602_1, 602_2, \ldots, 602_n$ each having a first source/drain terminal 402a and a second source/drain terminal 402b, wherein the first source/drain terminals 402a of the second field effect transistors $602_1, 602_2, \ldots, 602_n$ are all coupled to the second output 404 and the second source/drain terminals 402b are all coupled to the reference potential 405.

The first field effect transistors $601_1, 601_2, \ldots, 601_n$ and the second field effect transistors $602_1, 602_2, \ldots, 602_n$ are configured as self-protected NMOS field effect transistors, e.g. as thick-oxide NMOS field effect transistors in accordance with one embodiment. In accordance with another embodiment, PMOS field effect transistors may be used.

In accordance with the embodiment shown in FIG. 6, the number of first field effect transistors equals the number of second field effect transistors. In accordance with one embodiment, the first field effect transistors and the second field effect transistors may all have the same device width. In accordance with other embodiments, at least one of the first and/or second field effect transistors may have a different device width. For example, in accordance with one embodiment, the device width of the i-th first field effect transistor $601_i$ (i=1, . . . , n) may be $w \times 2^i$ (wherein w is a predeterminable constant) such that a binary coding may be achieved for the total device width $W_1$ (that is, the sum of the device widths of all first field effect transistors), such that $W_1 = w \times \Sigma_i a_i \times 2^i$, wherein $a_i \in \{0, 1\}$. Similarly, the device width of the i-th second field effect transistor $602_i$ (i=1, . . . , n) may be $w \times 2^i$ such that a binary coding may be achieved for the total device width $W_2$ (that is, the sum of the device widths of all second field effect transistors), such that $W_2 = w \times \Sigma_i a_i \times 2^i$. In accordance with another embodiment, the device widths of the individual first and second field effect transistors may be chosen in such a manner, that a thermometer coding may be achieved for the total device widths $W_1$ and $W_2$. In accordance with other embodiments, though, the device widths may be chosen differently.

The gate voltage generator 406 of the write driver circuit 600 includes a control logic 628 (labelled "Control Logic") for selectively enabling one or more of the plurality of parallel first field effect transistors $601_1, 601_2, \ldots, 601_n$ and second field effect transistors $602_1, 602_2, \ldots, 602_n$. By means of the control logic 628, clearly the effective W/L ratio of the driver transistors Tn, Tp may be controlled as will be described in more detail hereinbelow.

The control logic 628 includes a first input that is coupled to the data input 407, at which a data input signal ("Data_in") may be provided. Furthermore, the control logic 628 includes a second input that is coupled to a first control signal input 629, at which a first control signal (labelled "W/L_Control") may be provided that may control, which one(s) of the first field effect transistors $601_1, 601_2, \ldots, 601_n$ and the second field effect transistors $602_1, 602_2, \ldots, 602_n$ will be enabled.

The control logic 628 further includes a third input coupled with the reference potential 405, and a fourth input, at which an internal supply voltage VDDint may be provided. The internal supply voltage VDDint is provided by a voltage control device 630 (labelled "VDDint Control") that is coupled between the fourth input of the control logic 628 and the first source/drain terminals 601a, 602a of the first and second field effect transistors $601_1, \ldots, 601_n, 602_1, \ldots, 602_n$. In other words, the voltage control device 630 includes an input that is connected midway between the two resistances 525, 526, and an output that is connected with the fourth input of the control logic 628.

In accordance with one embodiment, the voltage control device 630 may be configured as an operational amplifier and may be connected in a similar manner as the operational amplifier 524 shown in FIG. 5. That is, in this case a non-inverting input of the operational amplifier may be connected midway between the resistances 525 and 526, while a target voltage may be provided an an inverting input of the operational amplifier. Furthermore, an output of the operational amplifier may be connected with the fourth input of the control logic 628.

The control logic 628 further includes a plurality of first outputs, wherein in each case one of the first outputs is coupled with the gate terminal 601c of one of the first field effect transistors $601_1, 601_2, \ldots, 601_n$. Furthermore, the control logic 628 includes a plurality of second outputs, wherein in each case one of the second outputs is coupled with the gate terminal 602c of one of the second field effect transistors $602_1, 602_2, \ldots, 602_n$. In accordance with the embodiment shown in FIG. 6, the control logic 628 includes n first outputs and n second outputs, that is 2n outputs in total. In general, in accordance with one embodiment, the total number of outputs in the control logic $628$ may equal the total number of parallel transistors in the write driver circuit.

By means of the n first outputs of the control logic $628$, gate voltages Vgn_1, Vgn_2, ..., Vgn_n may be provided to the gate terminals $601c$ of the plurality of first field effect transistors $601_1$, $601_2$, ..., $601_n$. In other words, a gate voltage Vgn_1 may be provided to the gate terminal $601c$ of a first one $601_1$ of the first field effect transistors coupled to a first one of the first outputs of the control logic $628$, a gate voltage Vgn_2 may be provided to the gate terminal $601c$ of a second one $601_2$ of the first field effect transistors coupled to a second one of the first outputs of the control logic $628$, etc. Similarly, by means of the n second outputs of the control logic $628$, gate voltages Vgp_1, Vgp_2, ..., Vgp_n may be provided to the gate terminals $602c$ of the plurality of second field effect transistors $602_1$, $602_2$, ..., $602_n$. In other words, a gate voltage Vgp_1 may be provided to the gate terminal of a first one $602_1$ of the second field effect transistors coupled to a first one of the second outputs of the control logic $628$, a gate voltage Vgp_2 may be provided to the gate terminal $601c$ of a second one $602_2$ of the second field effect transistors coupled to a second one of the second outputs of the control logic $628$, etc.

Clearly, the control logic $628$ is configured to control the gate control voltages Vgn_i (i=1, 2, ..., n) provided to the gate terminals $601c$ of the first field effect transistors $601_i$ (i=1, 2, ..., n), and the gate control voltages Vgp_i (i=1, 2, ..., n) provided to the gate terminals $602c$ of the second field effect transistors $602_i$ (i=1, 2, ..., n). The gate control voltages Vgn_i/Vgp_i may toggle between the VSS reference potential (provided at the third input of the control logic $628$) and the internal supply voltage VDDint (provided at the fourth input of the control logic $628$ by the voltage control device $630$).

The control logic $628$ may be configured in such a way that only a part of the first field effect transistors $601_i$ (i=1, 2, ..., n) and/or the second field effect transistors $602_i$ (i=1, 2, ..., n) will be enabled (or operated) while the remaining ones are permanently disabled (in other words, switched off). The switching-off of one of the field effect transistors $601_i$ (i=1, 2, ..., n) and $602_i$ (i=1, 2, ..., n) may, for example, be achieved by permanently providing the VSS potential to the gate terminal of that transistor. The information on which (or how many) of the field effect transistors $601_i$ and/or $602_i$ are in operation and which are to be disabled may be conveyed, for example, by means of providing a suitable control signal "W/L_Control" at the first control signal input $629$. Clearly, by determining the number of transistors that are in operation, the effective W/L ratio of the driver transistors Tn/Tp in the write driver circuit $600$ may be controlled.

The write driver circuit $600$ further includes as a first load device a plurality of first resistors $609_1$, $609_2$, ..., $609_k$ electrically connected in parallel to one another, as well as a plurality of second resistors $610_1$, $610_2$, ..., $610_k$ electrically connected in parallel to one another, as a second load device. In other words, in the write driver circuit $600$ the single pull-up resistor $409$ is replaced by k (k being a natural number) parallel first resistors $609_1$, $609_2$, ..., $609_k$, and the single pull-up resistor $410$ is replaced by k parallel second resistors $610_1$, $610_2$, ..., $610_k$.

In accordance with the embodiment shown in FIG. 6, the number of first resistors equals the number of second resistors. As shown in FIG. 6, the i-th first resistor $609_i$ (i ∈ {1, 2, ..., k}) has a resistance Rn_i and the i-th second resistor $610_i$ (i ∈ {1, 2, ..., k}) has a resistance Rp_i. In accordance with one embodiment, the first and second resistors may all have the same resistance. In accordance with other embodiments, at least one of the first and/or second resistors may have a different resistance. In accordance with one embodiment, the resistances of the individual first and second resistors may be chosen such that a binary coding may be achieved for the total resistances in a similar manner as described above in connection with the device widths of the first and second field effect transistors. In another embodiment, the resistances may be chosen such that a thermometer coding is achieved for the total resistances. In accordance with other embodiments, though, the individual resistances may be chosen differently.

The write driver circuit $600$ further includes a switch network $633$ for selectively enabling one or more of the plurality of resistors $609_1$, $609_2$, ..., $609_k$, $610_1$, $610_2$, ..., $610_k$. The switch network $633$ includes a plurality of switches $631_1$, $631_2$, ..., $631_k$, $632_1$, $632_2$, ..., $632_k$, wherein in each case one switch is connected in series with one resistor of the plurality of resistors. In accordance with some embodiments, at least one of the switches $631_1$, $631_2$, ..., $631_k$, $632_1$, $632_2$, ..., $632_k$, may be configured as a MOS switch, e.g. as a PMOS switch in one embodiment. In accordance with other embodiments, though, the switch or switches may be realized in another suitable way.

Clearly, the plurality of switches $631_1$, $631_2$, ..., $631_k$, $632_1$, $632_2$, ..., $632_k$ includes k first switches $631_1$, $631_2$, ..., $631_k$ wherein the i-th first switch $631_i$ (i ∈ {1, 2, ..., k}) is connected in series with the i-th first resistor $609_i$, and further includes k second switches $632_1$, $632_2$, ..., $632_k$ wherein the i-th second switch $632_i$ is connected in series with the i-th second resistor $610_i$ (i ∈ {1, 2, ..., k}). In other words, each of the first switches $631_1$, $631_2$, ..., $631_k$ includes a first terminal and a second terminal wherein the first terminals of the first switches $631_1$, $631_2$, ..., $631_k$ are all coupled to the common electrical node $421$, and the second terminal of the i-th first switch $631_i$ (i ∈ 1, 2, ..., k) is coupled to a first terminal of the i-th first resistor $609_i$ (a second terminal of the i-th first resistor $609_i$ being coupled to the first source/drain terminals $601a$ of the parallel first field effect transistors $601_1$, $601_2$, ..., $601_n$). Similarly, each of the second switches $632_1$, $632_2$, ..., $632_k$ includes a first terminal and a second terminal wherein the first terminals of the second switches $632_1$, $632_2$, ..., $632_k$ are all coupled to the common node $421$, and the second terminal of the i-th second switch $632_i$ (i ∈ 1, 2, ..., k) is coupled to a first terminal of the i-th second resistor $610_i$ (a second terminal of the i-th second resistor $610_i$ being coupled to the first source/drain terminals $602a$ of the parallel second field effect transistors $602_1$, $602_2$, ..., $602_n$).

The switch network $633$ is coupled to a second control signal input $634$, at which a second control signal (labelled "R_Control") may be provided that may control, which one(s) of the first switches $631_1$, $631_2$, ..., $631_k$ and the second switches $632_1$, $632_2$, ..., $632_k$ of the switch network $633$ will be closed.

Clearly, the switch network $633$ is coupled between the common node $421$ and the parallel first resistors $609_1$, $609_2$, ... $609_k$ and between the node $421$ and the parallel second resistors $610_1$, $610_2$, ... $610_k$. By means of the switch network $633$, one or more of the parallel resistances Rn_1, Rn_2, ..., Rn_k may be switched in series to the first driver transistor Tn, and one or more of the parallel resistances Rp_1, Rp_2, ..., Rp_k may be switched in series to the second driver transistor Tp, wherein the information on which (or how many) of the resistances Rn_1, Rn2, ..., Rn_k, Rp_1, Rp_2, ..., Rp_k are to be enabled may be conveyed, for example, by means of providing a suitable control signal "R_Control" at the second control signal input 634. Clearly, by determining the number of switches that are closed, the effective resistive loads coupled in series to the driver transistors Tn, Tp may be controlled.

The write driver circuit 600 shown in FIG. 6 includes a pass circuit 420 that is coupled in between the switch network 633 and the second reference potential 408 (VDD), and the common node 421 is at the common mode level Vcm which may be lower than VDD. In accordance with other embodiments, the pass circuit 420 may be omitted or may be a short to VDD, such that Vcm=VDD in this case.

In the following, certain features and properties of the write driver circuit 600 will be described in more detail.

Clearly, the write driver circuit 600 shown in FIG. 6 includes pull-up resistance and W/L control. Various values may be set for the effective pull-up resistances Rn and Rp. By configuring the pull-up resistances Rn and Rp in the write driver circuit 600 in each case as k resistors connected in parallel, each resistor with a series switch, the effective pull-up resistances Rn and Rp may be adjusted. Clearly, the effective pull-up resistance Rn is given by $$1/Rn = \sum_{i=1}^{k} a_i / Rn\_i,$$

wherein the coefficients $a_i \in \{0, 1\}$ indicate whether the series switch $631_i$ is closed ($a_i=1$) or open ($a_i=0$). Similarly, the effective pull-up resistance Rp is given by $$1/Rp = \sum_{i=1}^{k} b_i / Rp\_i,$$

wherein the coefficients $b_i \in \{0, 1\}$ indicate whether the series switch $632_i$ is closed ($b_i=1$) or open ($b_i=0$).

Figure 7:
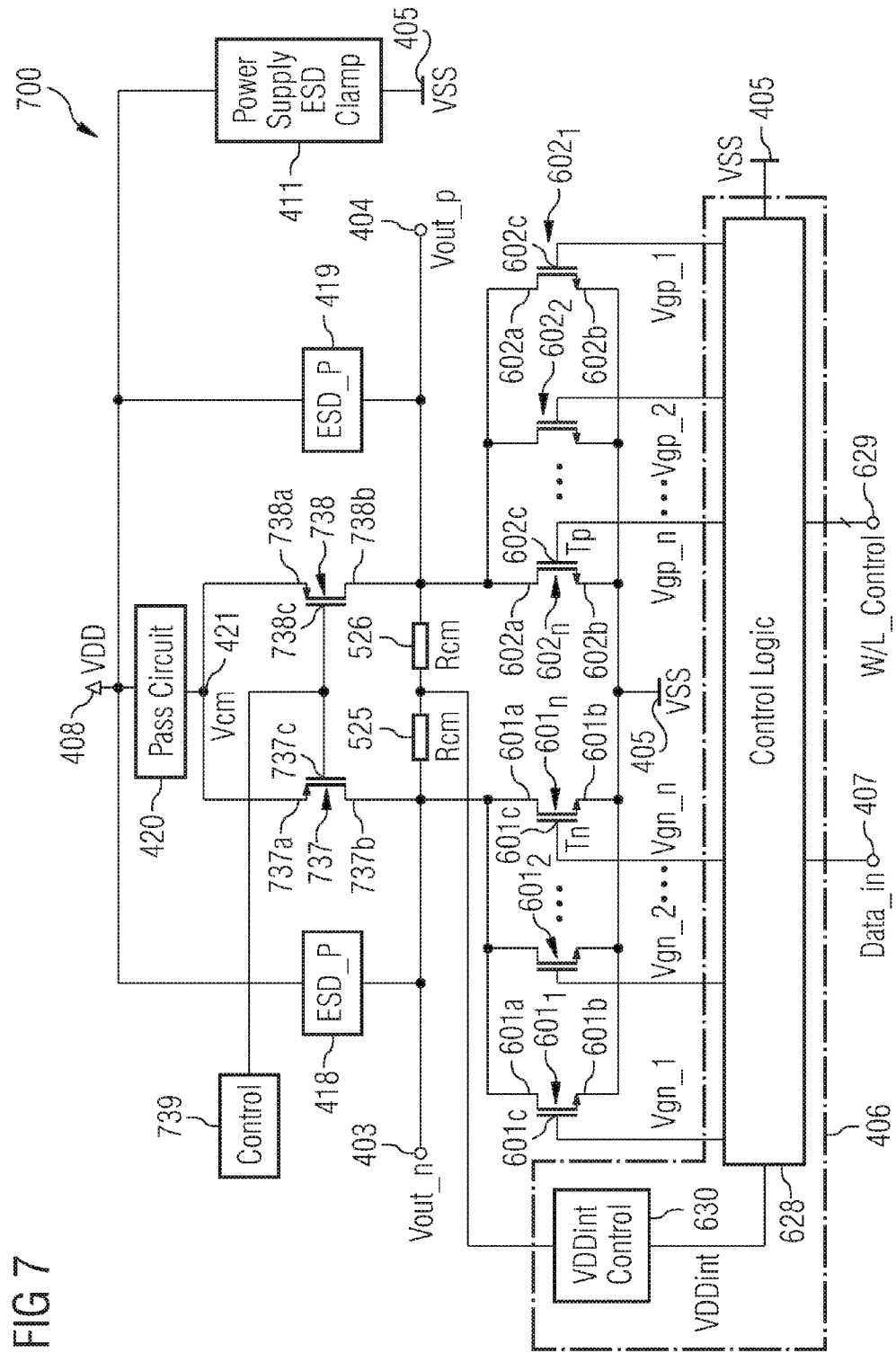
FIG. 7 shows another illustrative embodiment of a write driver circuit.

In in a write driver circuit 700 in accordance with another embodiment shown in FIG. 7, MOSFET transistors (e.g. PMOS devices as shown in FIG. 7), for example thick-oxide transistors, operating in linear mode may be used as an alternative to the pull-up network shown in FIG. 6 including resistors Rn/Rp with switches in series. In the write driver circuit 700, a first thick-oxide PMOS-FET 737 having a first source/drain terminal 737a, a second source/drain terminal 737b, and a gate terminal 737c, is coupled between between the pass circuit 420 and the first source/drain terminal 601a of the first field effect transistors $601_1, \ldots, 601_n$, and a second thick-oxide PMOS-FET 738 having a first source/drain terminal 738a, a second source drain terminal 738b, and a gate terminal 738c, is coupled between between the pass circuit 420 and the first source/drain terminal 602a of the second field effect transistors $602_1, \ldots, 602_n$. By means of a separate control circuit 739 the gate-source voltage of these (pull-up) transistors 737, 738 may be adjusted such that the channel resistance of the transistors 737, 738 matches a target resistance value. The separate control circuit 739 may provide a third reference potential to which the pull-up transistors 737, 738 may be connected to bring them into linear operation. The pull-up resistance control may be performed by connecting the gates 737c, 738c of the transistors 737, 738 to that reference voltage to turn the resistance on. Switching the resistance off may be performed by connecting the gates 737c, 738c to the second reference potential. One effect of the write driver circuit 700 shown in FIG. 7 is that the pull-up resistance may be controlled with only one device in the respective pull-up path. In accordance with another embodiment, each of the transistors 737 and 738 may be replaced by k devices operated in parallel with similar options for weighting the devices, as described above (e.g., binary control, thermometer or other).

One effect of the pull-up resistance adjustment described in connection with the embodiments shown in FIG. 6 and FIG. 7 can be seen in that load capacitance variations in a write driver circuit may be compensated.

In accordance with one embodiment, VDDint may be adjusted to maintain the same output swing.

Another effect can be seen in that the switching of resistors may also be used to save power. For example, a low-power mode may be achieved by switching Rn/Rp to a higher value.

If, as shown in FIG. 6 and FIG. 7, the driver transistors Tn/Tp are configured as n parallel connected devices, then the logic 628 may, in accordance with one embodiment, be used to turn off branches and in such a way to maintain the same ratio of W/L to R. In this case, VDDint may, for example, be unchanged, which may allow a fast power up, e.g. to a full-speed modus with smallest pull-up resistance.

In accordance with another embodiment, the adjustment of the W/L value of Tn/Tp may also be performed dynamically. For example, the gate voltages Vgn_i/Vgp_i of the n parallel first field effect transistors $601_1, 601_2, \ldots, 601_n$ and the n parallel second field effect transistors $602_1, 602_2, \ldots, 602_n$ may be controlled by the logic 628 to perform e.g. a step-wise voltage change at the outputs. This may be used, for example, in systems that use a control of the shape of the output waveform by dynamically adjusting amplitude levels to reduce or eliminate channel induced intersymbol interference (ISI). For example, in accordance with one embodiment, a staircase-like rising or falling edge may be generated by successively switching Vgn_i/Vgp_i to VDDint. Such control of output signal amplitude levels may be referred to under the term "pre-emphasis".

In accordance with another embodiment, the output devices' on/off relation may be controlled by the logic 628 that may generate the gate voltages Vgn_i/Vgp_i in such a manner, that the duty-cycle of the output waveform is altered. This method may, for example, also be used for reducing or eliminating intersymbol interferences (ISI) and may be referred to under the term "pre-compensation".

While the circuits 400, 500, 600 and 700 described herein above in connection with FIG. 4A to FIG. 7 where primarily discussed in the context of NMOS implementations, it is noted that, in accordance with alternative embodiments, also PMOS implementations are possible. For example, in accordance with some embodiments, the snap-back ESD mechanism may also be exploited in PMOS devices, a self-protected ESD layout may be achieved, and a similar method to control the output currents by setting gate voltage levels of the open-drain PMOS transistors is applicable.

With reference now to FIG. 8, a method 800 of manufacturing a write driver circuit in accordance with an illustrative embodiment will be described below.

In 802, a first field effect transistor is provided. The first field effect transistor includes a first source/drain terminal coupled to a first output, a second source/drain terminal coupled with a reference potential, and a gate terminal. The first field effect transistor is configured as a self-protected field effect transistor, for example as a thick-oxide field effect transistor in accordance with one embodiment.

In 804, a second field effect transistor is provided. The second field effect transistor includes a first source/drain terminal coupled to a second output, a second source/drain terminal coupled with the reference potential, and a gate terminal. The second field effect transistor is configured as a self-protected field effect transistor, for example as a thick-oxide field effect transistor in accordance with one embodiment.

In 806, a gate voltage generator is provided. The gate voltage generator is coupled to the gate terminals of the first and second field effect transistors. In accordance with an embodiment, the gate voltage generator may be configured to provide a gate voltage to the gate terminals of the first and second field effect transistors such that the first and second field effect transistors are operated in saturation when enabled.

In the following, additional features and potential effects of illustrative embodiments are described.

In accordance with some embodiments, an improved write driver design is provided, wherein parasitic capacitances are reduced both in the main devices and in ESD circuits.

In accordance with some embodiments, write driver architectures and corresponding fabrication methods are provided wherein a high robustness against ESD discharge events is achieved using only standard ESD devices. Thus, special ESD clamps such as, for example, low-capacitance SCR clamps, which may not be available in the device portfolio, are not be needed in accordance with some embodiments.

In accordance with some embodiments, write driver circuits are provided that allow for high output common-mode voltage operation with large signal swings with minimized parasitic capacitances at the write pads.

In accordance with some embodiments, a high ESD robustness may be achieved in a write driver circuit by using thick-oxide transistors as driver devices.

In accordance with some embodiments, write driver circuits are provided, wherein the self-protection of thick-oxide NMOS transistors using the snap-back effect makes additional ESD protection clamps obsolete.

In accordance with some embodiments, the ESD robustness of a write driver circuit may be further enhanced by placing optional ESD clamps.

In accordance with some embodiments, a low parasitic capacitance may be achieved with standard ESD elements.

In accordance with some embodiments, the signal level may be controlled for various common-mode voltages by connecting the gate voltages Vgn/Vgp of open-drain devices Tn/Tp to a regulated voltage VDDint and optionally setting a common-mode reference voltage Vcm with a pass circuit.

In accordance with some embodiments, a common-mode level may be adjusted independently by setting a node Vcm. In accordance with one embodiment, in order to maintain the signal swing, a target voltage Vcm target may be set in reference to Vcm.

In accordance with some embodiments, low-power modes may be implemented by switching pull-up resistances.

In accordance with some embodiments, fast power-up times may be achieved by switching both pull-up resistances and W/L of the open drain transistors such that the ratio between the pull-up resistance and the W/L of the transistor is kept constant in order to maintain equal VDDint.

In accordance with some embodiments, a logic to control the effective W/L of the open drain devices may be implemented for flexible control of the amount of current which the open drain drivers sink. If, in accordance with one embodiment, this logic is switched in a dynamic manner, then signal transition may be controlled. This may, for example, be used for a pre-emphasis (=adjusting the signal swing) or a pre-compensation (=adjusting the signal duty-cycle) of the write output signal.

In accordance with some embodiments, an ESD concept is provided that uses self-protected transistors Tn and Tp, which are operated as switches that pull the output voltages to VSS. In accordance with these embodiments, a loop that sets VDDint is not necessary. The gate voltages may be driven directly from a digital supply, e.g. VDDlow (cf. FIG. 2). In accordance with some embodiments, a proper signal swing may be established by definition of the voltage at node Vcm using a low pass circuit.

In accordance with some embodiments, the capacitance at the write pins of a write driver circuit may be minimized by making use of the large size used to handle the currents flowing in the output transistors and designing an ESD layout in such a manner that the output devices are self-protected. Therefore and to handle high output common-mode levels, thick-oxide transistors may be used in accordance with some embodiments. The snap-back effect of the parasitic NPN of these devices may be used to prevent gate-oxide breakdown. For example, the trigger voltage for snap-back may be about 6 V while the gate-oxide breakdown voltage may be higher, for example in the range from about 9 V to about 10 V. In accordance with some embodiments, to allow ESD discharge currents to flow to a low impedance node, the output devices may be designed as open-drain drivers with the sources of the differential arrangement connected to VSS and the drains to the output lines. Thus, all possible ESD stress cases may be handled, for example together with a standard ggNMOS ESD power clamp, in accordance with some embodiments. Additional ESD clamps are not necessary removing completely their parasitic capacitances.

In accordance with some embodiments, the output swing may be controlled by adjusting the gate voltages of the pull-down transistors such that these devices may effectively work as current sources when turned on. Therefore, in accordance with some embodiments, the same signal swing may be achieved at various output common-mode levels, which may be independently controlled, for example, in accordance with given specifications.

In accordance with some embodiments, write driver circuits are provided that allow the design of a flexible pull-up and pull-down (W/L) network by incorporation of switching logic(s) for R and/or W/L control. Thus, in accordance with some embodiments, a pre-emphasis and/or a pre-compensation may easily be incorporated.

Write driver circuits or architectures in accordance with the embodiments described herein may, for example, be suited for any data sending circuit. One example may be a write driver of a Read-Write (R/W) channel for hard disk drives. Other examples can be seen in products that use pre-compensation of signal duty-cycle or pre-emphasis of signal transitions and a high signal common-mode.

In accordance with some embodiments, the use of self-protected transistors in a write driver circuit may provide for an ESD configuration that spares any additional ESD clamps at the pins and protects the circuit, for example, together with a standard power-clamp for high power supply voltages in accordance with one embodiment.

In accordance with some embodiments, standard ESD devices may be used.

In accordance with some embodiments, the snap-back effect of NMOS devices may be used to create a discharge path for ESD currents from a pin to VSS in a write driver circuit.

In accordance with some embodiments, thick-oxide transistors may be used in a write driver circuit to handle high common-mode voltages and power supply voltages.

In accordance with some embodiments, output devices in a write driver circuit are operated as current source in saturation.

In accordance with some embodiments, output devices in a write driver circuit are configured in open-drain configuration and may be operated at a high common-mode voltage.

In accordance with some embodiments, the gate voltage of output devices in a write driver circuit may be controlled using a feedback loop such that a target common-mode voltage at the pins is maintained.

In accordance with some embodiments, the gate voltage of output devices in a write driver circuit may be controlled in such a manner that the target common-mode voltage is proportional to a predetermined output swing.

In accordance with some embodiments, an independent control of an output common-mode voltage may be achieved in a write driver circuit by adjustment of a voltage level of a common node to which all load devices (e.g., resistors) connect.

In accordance with some embodiments, an output target common-mode voltage may be set relative to an AC ground voltage Vcm derived by a pass circuit.

In accordance with some embodiments, a switching circuit may be used in a write driver circuit to control the W/L ratio of open-drain output devices. The switching circuit may be controlled by means of digital signals, in accordance with an embodiment.

In accordance with some embodiments, a switching circuit may be used to control a pull-up resistance, e.g. in a parallel resistor network.

In accordance with some embodiments, output signal levels in a write driver circuit may be pre-emphasized by use of a logic circuit that controls the W/L ratio of open-drain output devices, in other words, by adjusting the output current generated by the driver transistors.

In accordance with some embodiments, a pre-compensation may be achieved in a write driver circuit by use of a logic circuit that controls an open-drain driver on/off state in such a manner, that an output duty-cycle is adjustable.

In accordance with some embodiments, a write driver circuit is provided, wherein an output common-mode voltage may exceed the maximum tolerated voltage level of thin-oxide core devices. In other words, the write driver circuit may be used with higher common-mode voltages as are allowed for thin-oxide core transistors.

In accordance with some embodiments, a write driver circuit is provided, wherein robustness to ESD stress is maximized due to the use of thick-oxide self-protected field effect transistors at a first output and at a second output of the write driver circuit. In accordance with some embodiments, the use of self-protected thick-oxide field effect transistors may allow for a minimization of parasitic capacitance contributed to ESD protection devices at the first and second outputs. In accordance with one embodiment, a standard grounded-gate NMOS power supply ESD protection clamp may be used to add to the ESD protection concept of the self-protected thick-oxide field effect transistors that are connected to the first and second outputs.

A write driver circuit in accordance with some embodiments includes a first load device and a second load device, wherein at least one of the first and second load devices includes a plurality of transistors that operate in a linear region as resistors and are electrically connected in parallel to one another. In accordance with some embodiments, the write driver circuit includes a switch network for selectively enabling one or more of the plurality of transistors, the switch network including a plurality of switches, wherein in each case a first switch is connected between the gate of one transistor of the plurality of transistors and a third reference potential, and a second switch is from the gate of one transistor of the plurality of transistors to the second reference potential.

While various aspects of the invention have been particularly shown and described with reference to specific illustrative embodiments, it should be understood by those skilled in the art that various changes in form and detail may be made therein without departing from the spirit and scope of the invention as defined by the appended claims. The scope of the invention is thus indicated by the appended claims, and all changes which come within the meaning and range of equivalency of the claims are therefore intended to be embraced.

What is claimed is:

1. A write driver circuit, comprising:
    a first transistor comprising a first source/drain terminal coupled to a first output, a second source/drain terminal coupled with a first reference potential, and a gate terminal;
    a second transistor comprising a first source/drain terminal coupled to a second output, a second source/drain terminal coupled with the first reference potential, and a gate terminal; and
    a gate voltage generator coupled to the gate terminals of the first and second transistors,
    wherein the gate voltage generator is configured to provide a gate voltage to the gate terminals of the first and second transistors such that the first and second transistors are operated in saturation when enabled.

2. The write driver circuit of claim 1, further comprising:
    a first load device coupled between the first source/drain terminal of the first transistor and a second reference potential; and
    a second load device coupled between the first source/drain terminal of the second transistor and the second reference potential.

3. The write driver circuit of claim 2, further comprising a clamp device coupled between the first reference potential and the second reference potential.

4. The write driver circuit of claim 3, wherein the clamp device is configured as a grounded gate NMOS field effect transistor, a first source/drain terminal of the grounded gate NMOS field effect transistor coupled to the first reference potential and a second source/drain terminal of the grounded gate NMOS field effect transistor coupled to the second reference potential.

5. The write driver circuit of claim 2, further comprising at least one clamp device coupled between the second reference potential and at least one of the first source/drain terminal of the first transistor and the first source/drain terminal of the second transistor.

6. The write driver circuit of claim 2, further comprising a pass circuit coupled between the second reference potential and the first and second load devices, wherein the pass circuit is configured to establish a common-mode voltage at the first and second outputs that is unrelated to a differential output swing of the write driver circuit.

7. The write driver circuit of claim 2, wherein at least one of the first and second load devices comprises a plurality of resistors electrically coupled in parallel to one another.

8. The write driver circuit of claim 1, wherein the gate voltage generator comprises a control circuit coupled to the first source/drain terminals and to the gate terminals of the first and second transistors, wherein the control circuit comprises a feedback loop configured to establish a predetermined common-mode voltage at the first and second outputs that is related to a differential output swing of the write driver circuit.

9. The write driver circuit of claim 8, wherein the control circuit comprises:
   a first inverter;
   a second inverter; and
   an operational amplifier,
   wherein a first input of the first inverter is coupled to a data input and an output of the first inverter is coupled to the gate terminal of the first transistor,
   wherein a first input of the second inverter is coupled to the output of the first inverter and an output of the second inverter is coupled to the gate terminal of the second transistor,
   wherein a non-inverting input of the operational amplifier is coupled between the first source/drain terminal of the first transistor and the first source/drain terminal of the second transistor,
   wherein a predetermined voltage is provided at an inverting input of the operational amplifier, and
   wherein an output of the operational amplifier is coupled to a second input of the first inverter and to a second input of the second inverter.

10. The write driver circuit of claim 1, wherein at least one of the first and second transistors is configured as a thick-oxide field effect transistor.

11. The write driver circuit of claim 10, wherein the thick-oxide field effect transistor comprises a gate oxide with a thickness such that a snap-back voltage of the thick-oxide field effect transistor is lower than a breakdown voltage of the gate oxide.

12. The write driver circuit of claim 1, wherein the gate voltage generator comprises at least one device, the at least one device being configured as a minimal feature size device having the smallest structure size used on a chip on which the write driver circuit is formed.

13. The write driver circuit of claim 1, wherein the first transistor and the second transistor are each configured as a self-protected field effect transistor.

14. The write driver circuit of claim 13, wherein at least one of the first and second resistive loads comprises a plurality of resistors electrically coupled in parallel to one another; and wherein the write driver circuit further comprises a switch network for selectively enabling one or more of the plurality of resistors, the switch network comprising a plurality of switches each coupled in series with at least one of the plurality of resistors.

15. The write driver circuit of claim 1, further comprising:
   a first resistive load coupled between the first source/drain terminal of the first transistor and a second reference potential; and
   a second resistive load coupled between the first source/drain terminal of the second transistor and the second reference potential.

16. The write driver circuit of claim 1, wherein the first and second transistors each comprises a field effect transistor.

17. A write driver circuit, comprising:
   a first transistor comprising a first source/drain terminal coupled to a first output, a second source/drain terminal coupled with a first reference potential, and a gate terminal;
   a second transistor comprising a first source/drain terminal coupled to a second output, a second source/drain terminal coupled with the first reference potential, and a gate terminal; and
   a gate voltage generator coupled to the gate terminals of the first and second transistors
   wherein at least one of the first and second transistors comprises a plurality of transistors electrically coupled in parallel to one another.

18. The write driver circuit of claim 17, wherein the gate voltage generator comprises control logic configured to selectively enable at least one of the plurality of parallel transistors.

19. A write driver circuit, comprising:
   a first field effect transistor comprising a first source/drain terminal coupled to a first output, a second source/drain terminal coupled with a first reference potential, and a gate terminal;
   a second field effect transistor comprising a first source/drain terminal coupled to a second output, a second source/drain terminal coupled with the first reference potential, and a gate terminal; and
   means for generating a gate voltage at the gate terminals of the first and second field effect transistors such that the first and second field effect transistors are operated in saturation when enabled.

20. The write driver circuit of claim 19, wherein the first and second field effect transistors are each configured as a self-protected field effect transistor.

* * * * *